US012072388B2

(12) United States Patent
Lu

(10) Patent No.: US 12,072,388 B2
(45) Date of Patent: Aug. 27, 2024

(54) APPARATUS AND METHOD FOR DETECTING INTERNAL RESISTANCE OF BATTERY

(71) Applicant: Huawei Technologies Co., Ltd., Shenzhen (CN)

(72) Inventor: Huiqi Lu, Dongguan (CN)

(73) Assignee: HUAWEI TECHNOLOGIES CO., LTD., Guangdong (CN)

(*) Notice: Subject to any disclaimer, the term of this patent is extended or adjusted under 35 U.S.C. 154(b) by 148 days.

(21) Appl. No.: 17/758,189

(22) PCT Filed: Oct. 26, 2020

(86) PCT No.: PCT/CN2020/123745
§ 371 (c)(1),
(2) Date: Jun. 29, 2022

(87) PCT Pub. No.: WO2021/135565
PCT Pub. Date: Jul. 8, 2021

(65) Prior Publication Data
US 2022/0373604 A1 Nov. 24, 2022

(30) Foreign Application Priority Data
Dec. 31, 2019 (CN) ......................... 201911419774.7

(51) Int. Cl.
G01R 31/389 (2019.01)
G01R 31/3835 (2019.01)
(Continued)

(52) U.S. Cl.
CPC ....... *G01R 31/389* (2019.01); *G01R 31/3835* (2019.01); *H01M 10/44* (2013.01);
(Continued)

(58) Field of Classification Search
None
See application file for complete search history.

(56) References Cited

U.S. PATENT DOCUMENTS

2017/0187201 A1 6/2017 Wang et al.
2017/0234935 A1 8/2017 Schmidt
(Continued)

FOREIGN PATENT DOCUMENTS

CN 1763551 A 4/2006
CN 1975452 A 6/2007
(Continued)

*Primary Examiner* — Jas A Sanghera
(74) *Attorney, Agent, or Firm* — WOMBLE BOND DICKINSON (US) LLP

(57) ABSTRACT

This application discloses an apparatus and a method for detecting internal resistance of a battery, applied to the field of intelligent vehicles. The apparatus includes: a processing circuit, a differential amplifier, and a charging circuit. The processing circuit is configured to input a first comparison voltage to a second input end of the differential amplifier and maintain the first comparison voltage. The differential amplifier is configured to output a first output voltage based on the first detection voltage and the first comparison voltage. The processing circuit is further configured to control the charging circuit to charge the battery by using a constant current, and detect a second detection voltage of the battery after the battery is charged. The differential amplifier is further configured to output a second output voltage based on the second detection voltage and the first comparison voltage.

18 Claims, 11 Drawing Sheets

(51) Int. Cl.
  *H01M 10/44* (2006.01)
  *H01M 10/46* (2006.01)
  *H01M 10/48* (2006.01)
  *H02J 7/00* (2006.01)
(52) U.S. Cl.
  CPC ........... *H01M 10/46* (2013.01); *H01M 10/48* (2013.01); *H02J 7/007* (2013.01); *H01M 2220/20* (2013.01)

(56) References Cited

U.S. PATENT DOCUMENTS

2018/0210032 A1* 7/2018 Fujii ................... G01R 31/389
2018/0212279 A1   7/2018 Wang et al.

FOREIGN PATENT DOCUMENTS

| | | |
|---|---|---|
| CN | 201037864 Y | 3/2008 |
| CN | 201508409 U | 6/2010 |
| CN | 101806865 A | 8/2010 |
| CN | 201765311 U | 3/2011 |
| CN | 102012484 A | 4/2011 |
| CN | 103080762 A | 5/2013 |
| CN | 202916346 U | 5/2013 |
| CN | 103308858 A | 9/2013 |
| CN | 102645636 B | 5/2014 |
| CN | 203745616 U | 7/2014 |
| CN | 105092977 A | 11/2015 |
| CN | 105229482 A | 1/2016 |
| CN | 105277791 A | 1/2016 |
| CN | 108333521 A | 7/2018 |
| CN | 109061500 A | 12/2018 |
| CN | 109142872 A | 1/2019 |
| CN | 109581238 A | 4/2019 |
| CN | 109596996 A | 4/2019 |
| CN | 208888353 U | 5/2019 |
| CN | 209417262 U | 9/2019 |
| JP | 2009053012 A | 3/2009 |
| KR | 20160040887 A | 4/2016 |
| WO | 2006072501 A1 | 7/2006 |

\* cited by examiner

APPARATUS AND METHOD FOR DETECTING INTERNAL RESISTANCE OF BATTERY

CROSS-REFERENCE TO RELATED APPLICATIONS

This application is a National Stage of International Application No. PCT/CN2020/123745, filed on Oct. 26, 2020, which claims priority to Chinese Patent Application No. 201911419774.7, filed on Dec. 31, 2019, both of which are hereby incorporated by reference in their entireties This application relates to the field of intelligent vehicles, and in particular, to an apparatus and a method for detecting internal resistance of a battery.

BACKGROUND

A telematics box (T-Box) is an intelligent terminal loaded on a vehicle, and is mainly configured to implement communication between the vehicle and an internet of vehicles service platform. For example, the T-Box may be internally connected to a controller local area network bus (CAN-Bus) of the vehicle to transmit instructions and information, and may be externally interconnected with another device through a cloud platform. A backup battery is installed in the T-Box, and is configured to supply power to the T-Box in a special case. For example, when the vehicle collides and an input power supply cannot be normally used, the backup battery may supply power to the T-Box, to implement an emergency call function or a data uploading function of the T-Box. The backup battery is usually a battery such as a nickel metal hydride battery or a lithium battery, and a service life of the battery is shorter than a service life of the vehicle. To ensure normal use of the backup battery in the T-Box, the service life of the backup battery needs to be periodically detected. Currently, detecting internal resistance of a battery is a commonly used method for battery life detection.

In an internal resistance detection circuit of a battery provided in the conventional technology, voltages between two electrodes of the battery before and after charging are separately maintained by using two capacitors. However, a voltage maintained by a capacitor decreases with time. As a result, when the internal resistance of the battery is determined based on the voltage, an internal resistance measurement error is large.

SUMMARY

This application provides an apparatus and a method for detecting internal resistance of a battery, to resolve a problem in conventional technology that an internal resistance measurement error is large.

To achieve the foregoing objective, the following technical solutions are used in this application.

According to a first aspect, an apparatus for detecting internal resistance of a battery is provided. The apparatus includes a processing circuit, a differential amplifier, and a charging circuit. The battery is separately connected to the processing circuit, a first input end of the differential amplifier, and the charging circuit, and the processing circuit is further connected to an output end of the differential amplifier and the charging circuit. The processing circuit is configured to enter a first comparison voltage to a second input end of the differential amplifier and maintain the first comparison voltage, where a voltage value of the first comparison voltage is close to a voltage value of a first detection voltage before the battery is charged. For example, the voltage value of the first comparison voltage is equal to the voltage value of the first detection voltage. The differential amplifier is configured to output a first output voltage based on the first detection voltage and the first comparison voltage. The processing circuit is further configured to control the charging circuit to charge the battery by using a constant current, and detect a second detection voltage of the battery after the battery is charged. The differential amplifier is further configured to output a second output voltage based on the second detection voltage and the first comparison voltage. The processing circuit is further configured to determine the internal resistance of the battery based on the constant current, the first output voltage, and the second output voltage.

In an embodiment, the voltage value of the first comparison voltage entered by the processing circuit to the differential amplifier is equal to the voltage value of the first detection voltage before the battery is charged, and the voltage value of the first comparison voltage is set by the processing circuit, thereby ensuring stability of the first comparison voltage. The differential amplifier separately compares the first comparison voltage used as a reference voltage with the first detection voltage obtained before the battery is charged and the second detection voltage after the battery is charged and amplifies the first detection voltage and the second detection voltage, to determine the internal resistance of the battery based on amplified voltages. In addition, a deviation of the differential amplifier, and a deviation between digital-to-analog conversion (DAC) and analog-to-digital conversion (ADC) may be canceled in a process of determining the internal resistance. This reduces an internal resistance detection error, improves detection precision, and requires low precision of the differential amplifier by the apparatus.

In an embodiment, the processing circuit is further configured to, when detecting that the first detection voltage is in a preset voltage range, enter the first comparison voltage to the second input end of the differential amplifier. In the foregoing possible implementation, when the first detection voltage is in the preset voltage range, stability of the first detection voltage of the battery is good, so that stability of the detected first detection voltage and stability of a voltage value of the set first comparison voltage can be improved.

In an embodiment, the processing circuit is further configured to, when the first output voltage is beyond a preset output voltage range, adjust the first comparison voltage, so that the first output voltage is in the preset output voltage range. In the foregoing possible implementation, the first comparison voltage is adjusted, so that the first output voltage is in the preset output voltage range. This can improve stability of the first output voltage detected by the processing voltage.

In an embodiment, the processing circuit is a microprocessor having a first analog-to-digital conversion detection interface, a second analog-to-digital conversion detection interface, and a digital-to-analog conversion output interface. The microprocessor is configured to separately detect the first detection voltage and the second detection voltage through the first analog-to-digital conversion detection interface, separately detect the first output voltage and the second output voltage through the second analog-to-digital conversion detection interface, and output the first comparison voltage through the digital-to-analog conversion output interface. In the foregoing embodiment, when the processing circuit is the microprocessor, integration of the apparatus for detecting the internal resistance can be improved.

In an embodiment, the processing circuit includes: a digital-to-analog conversion circuit, and a microprocessor having a first analog-to-digital conversion detection interface, a second analog-to-digital conversion detection interface, and an analog signal output interface. The microprocessor is configured to separately detect the first detection voltage and the second detection voltage through the first analog-to-digital conversion detection interface, separately detect the first output voltage and the second output voltage through the second analog-to-digital conversion detection interface, and output a pulse-width modulation signal through the analog signal output interface. The digital-to-analog conversion circuit is configured to output the first comparison voltage after performing digital-to-analog conversion on the pulse-width modulation signal. In the foregoing embodiment, the microprocessor may be a commonly used microprocessor, so that costs of the microprocessor can be reduced.

In an embodiment, the digital-to-analog conversion circuit includes: an N-stage RC (resistance-capacitance) filter circuit, configured to perform filtering processing on the pulse-width modulation signal, where N is an integer greater than or equal to 1; and a voltage follower, configured to output the first comparison voltage based on the pulse-width modulation signal on which filtering processing is performed. In the foregoing embodiment, a simple and effective digital-to-analog conversion circuit is provided.

In an embodiment, the constant current is greater than 0 milliamperes (mA) and less than 200 mA. In the foregoing possible implementation, when the constant current is greater than 0 mA and less than 200 mA, accuracy of internal resistance detection can be further improved.

In an embodiment, the processing circuit and the differential amplifier are integrated in an integrated circuit chip. In the foregoing embodiment, integration of the apparatus for detecting the internal resistance can be improved.

In an embodiment, the processing circuit, the differential amplifier, and the charging circuit are integrated in an integrated circuit chip. In the foregoing possible implementation, integration of the apparatus for detecting the internal resistance can be improved.

According to a second aspect, a terminal is provided. The terminal includes a processor, a memory, a communications interface, a bus, and the apparatus for detecting the internal resistance of the battery according to the first aspect or any one of the aforementioned embodiments. The apparatus may include the battery. The processor, the memory, the communications interface, and the battery are connected through the bus, and the battery is configured to supply power to the processor, the memory, and the communications interface.

In an embodiment, the terminal is a vehicle.

According to a third aspect, a chip system is provided. The chip system includes a battery and the apparatus for detecting the internal resistance of the battery according to the first aspect or any one of the possible implementations of the first aspect. The battery may be integrated with the apparatus for detecting the internal resistance, or may not be integrated with the apparatus for detecting the internal resistance.

In an embodiment, the chip system further includes: a processor, a memory, a communications interface, and a bus. The processor, the memory, the communications interface, and the battery are connected through the bus, and the battery is configured to supply power to the processor, the memory, and the communications interface.

According to a fourth aspect, a method for detecting internal resistance of a battery is provided, applied to an apparatus including a processing circuit, a differential amplifier, and a charging circuit. The battery is separately connected to the processing circuit, a first input end of the differential amplifier, and the charging circuit, and the processing circuit is further connected to an output end of the differential amplifier and the charging circuit. The processing circuit enters a first comparison voltage to a second input end of the differential amplifier and maintains the first comparison voltage, where a voltage value of the first comparison voltage is close to a voltage value of a first detection voltage before the battery is charged. The differential amplifier outputs a first output voltage based on the first detection voltage and the first comparison voltage. The processing circuit controls the charging circuit to charge the battery by using a constant current, and detects a second detection voltage of the battery after the battery is charged. The differential amplifier outputs a second output voltage based on the second detection voltage and the first comparison voltage. The processing circuit determines the internal resistance of the battery based on the constant current, the first output voltage, and the second output voltage.

In an embodiment, applying or supplying the first comparison voltage to the second input end of the differential amplifier includes: when detecting that the first detection voltage is in a preset voltage range, entering the first comparison voltage to the second input end of the differential amplifier.

In an embodiment, when the first output voltage is beyond a preset output voltage range, the processing circuit adjusts the first comparison voltage, so that the first output voltage is in the preset output voltage range.

In an embodiment, the processing circuit is a microprocessor having a first analog-to-digital conversion detection interface, a second analog-to-digital conversion detection interface, and a digital-to-analog conversion output interface. The method further includes separately detecting the first detection voltage and the second detection voltage through the first analog-to-digital conversion detection interface, separately detecting the first output voltage and the second output voltage through the second analog-to-digital conversion detection interface, and outputting the first comparison voltage through the digital-to-analog conversion output interface.

In an embodiment, the processing circuit includes: a digital-to-analog conversion circuit, and a microprocessor having a first analog-to-digital conversion detection interface, a second analog-to-digital conversion detection interface, and an analog signal output interface. The microprocessor separately detects the first detection voltage and the second detection voltage through the first analog-to-digital conversion detection interface, separately detect the first output voltage and the second output voltage through the second analog-to-digital conversion detection interface, and output a pulse-width modulation signal through the analog signal output interface. The digital-to-analog conversion circuit outputs the first comparison voltage after performing digital-to-analog conversion on the pulse-width modulation signal.

In an embodiment, outputting the first comparison voltage after performing digital-to-analog conversion on the pulse-width modulation signal includes: performing filtering processing on the pulse-width modulation signal; and outputting the first comparison voltage based on the pulse-width modulation signal on which filtering processing is performed.

In an embodiment, the constant current is greater than 0 mA and less than 200 mA.

It may be understood that any one of the method for detecting the internal resistance of the battery, the terminal, the chip system, and the like provided above include the apparatus for detecting the internal resistance of the battery provided above. Therefore, for beneficial effects that can be achieved by the method, the terminal, the chip system, and the like, refer to beneficial effects of the corresponding apparatus for detecting the internal resistance of the battery provided above. Details are not described herein again.

DETAILED DESCRIPTION OF ILLUSTRATIVE EMBODIMENTS

Figure 1:
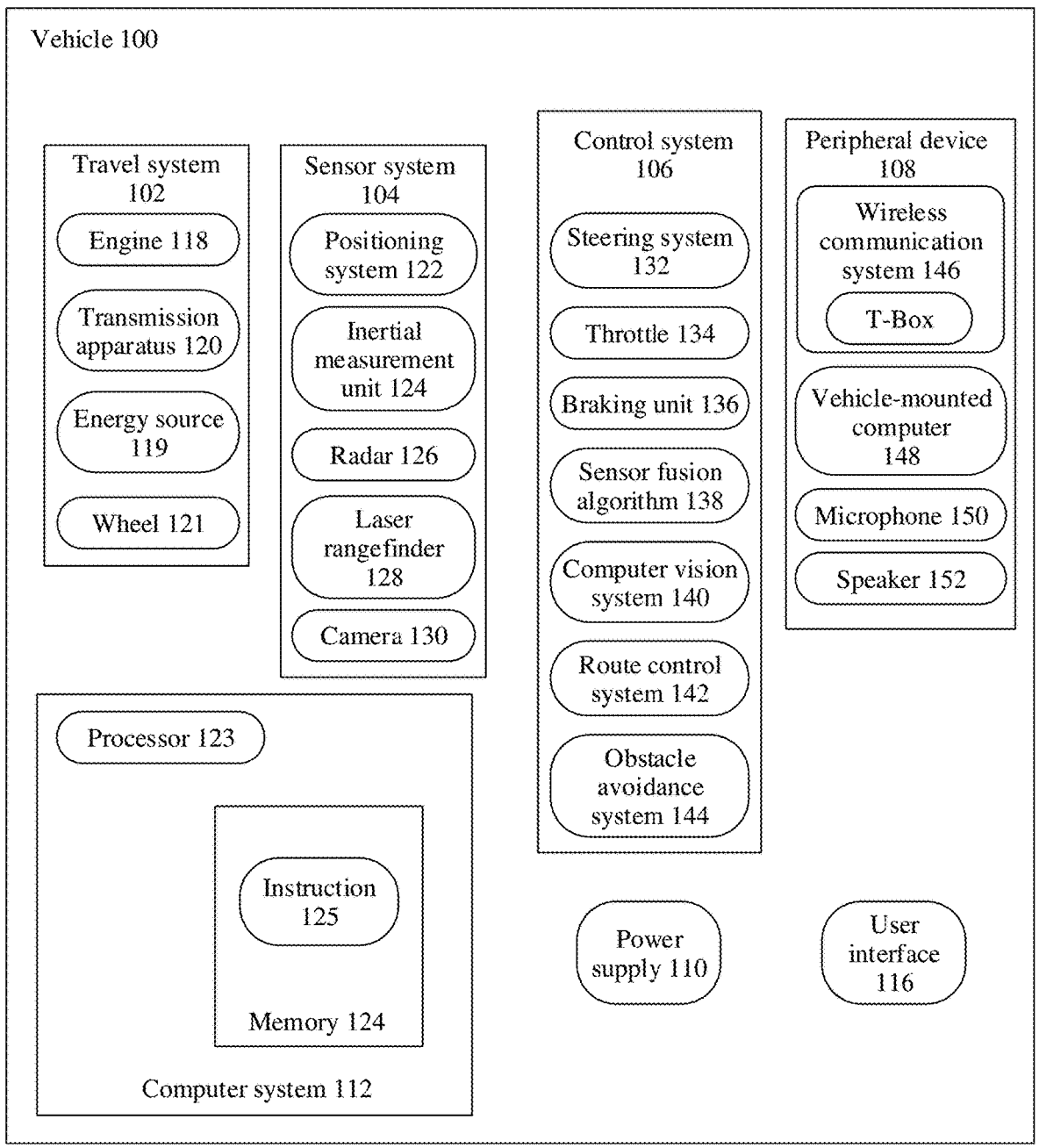
FIG. 1 is a diagram of a system architecture of a vehicle 100 according to an embodiment of this application.

FIG. 1 is a functional block diagram of a vehicle 100 having an autonomous driving function according to an embodiment of this application. In an embodiment, the vehicle 100 is configured to be in a fully or partially autonomous driving mode. For example, the vehicle 100 in the autonomous driving mode may control the vehicle 100. A manual operation may be performed to determine current statuses of the vehicle and an ambient environment of the vehicle, determine possible behavior of at least one another vehicle in the ambient environment, determine a confidence level corresponding to a possibility that the another vehicle performs the possible behavior, and control the vehicle 100 based on determined information. When the vehicle 100 is in the autonomous driving mode, the vehicle 100 may be set to operate without interacting with a person.

The vehicle 100 may include various subsystems, for example, a travel system 102, a sensor system 104, a control system 106, one or more peripheral devices 108, a power supply 110, a computer system 112, and a user interface 116. Optionally, the vehicle 100 may include more or fewer subsystems, and each subsystem may include a plurality of elements. In addition, each subsystem and element of the vehicle 100 may be interconnected in a wired or wireless manner.

The travel system 102 may include a component providing power motion to the vehicle 100. In an embodiment, the travel system 102 may include an engine 118, an energy source 119, a transmission apparatus 120, and wheels/tires 121. The engine 118 may be an internal combustion engine, an electric motor, an air compression engine, or a combination of other types of engines, for example, a hybrid engine including a gasoline engine and an electric motor, or a hybrid engine including an internal combustion engine and an air compression engine. The engine 118 converts the energy source 119 into mechanical energy.

Examples of the energy source 119 include gasoline, diesel, other oil-based fuels, propane, other compressed gas-based fuels, ethanol, solar panels, batteries, and other power sources. The energy source 119 may also provide energy to another system of the vehicle 100.

The transmission apparatus 120 may transmit mechanical power from the engine 118 to the wheels 121. The transmission apparatus 120 may include a gearbox, a differential, and a drive shaft. In an embodiment, the transmission apparatus 120 may further include another component, for example, a clutch. The drive shaft may include one or more shafts that may be coupled to one or more wheels 121.

The sensor system 104 may include several sensors that sense information about the ambient environment of the vehicle 100. For example, the sensor system 104 may include a positioning system 122 (the positioning system may be a global positioning system (GPS), or may be a BeiDou system or another positioning system), an inertial measurement unit (IMU) 124, radar 126, a laser rangefinder 128, and a camera 130. The sensor system 104 may further include a sensor (for example, an in-vehicle air quality monitor, a fuel gauge, or an engine oil thermometer) of an internal system of the monitored vehicle 100. Sensor data from one or more of these sensors can be used to detect an object and corresponding features (a position, a shape, a direction, a speed, and the like) of the object. Such detection and recognition are key functions of a safe operation of the autonomous vehicle 100.

The positioning system 122 may be configured to estimate a geographic position of the vehicle 100. The IMU 124 is configured to sense position and orientation changes of the vehicle 100 based on an inertial acceleration. In an embodiment, the IMU 124 may be a combination of an accelerometer and a gyroscope.

The radar 126 may sense an object in the ambient environment of the vehicle 100 through a radio signal. In some embodiments, in addition to sensing the object, the radar 126 may be configured to sense a speed and/or an advancing direction of the object.

The laser rangefinder 128 may sense, through a laser, an object in the environment of the vehicle 100. In some embodiments, the laser rangefinder 128 may include one or more laser sources, a laser scanner, one or more detectors, and another system component.

The camera 130 may be configured to capture a plurality of images of the ambient environment of the vehicle 100. The camera 130 may be a static camera or a video camera.

The control system 106 controls operations of the vehicle 100 and components of the vehicle 100. The control system 106 may include various elements, including a steering system 132, a throttle 134, a braking unit 136, a sensor fusion algorithm 138, a computer vision system 140, a route control system 142, and an obstacle avoidance system 144. The obstacle avoidance system 144 may also be referred to as an obstacle avoidance system.

The steering system 132 is operable to adjust an advancing direction of the vehicle 100. For example, in an embodiment, the steering system 132 may be a steering wheel system.

The throttle 134 is configured to control an operating speed of the engine 118 and further control a speed of the vehicle 100.

The braking unit 136 is configured to control the vehicle 100 to decelerate. The braking unit 136 may use friction to slow down the wheels 121. In another embodiment, the braking unit 136 may convert kinetic energy of the wheels 121 into a current. Alternatively, the braking unit 136 may reduce a rotational speed of the wheels 121 in another form to control the speed of the vehicle 100.

The computer vision system 140 is operable to process and analyze the image captured by the camera 130, to recognize the object and/or a feature in the ambient environment of the vehicle 100. The object and/or feature may include a traffic signal, a road boundary, and an obstacle. The computer vision system 140 may use an object recognition algorithm, a structure from motion (SFM) algorithm, video tracking, and other computer vision technologies. In some embodiments, the computer vision system 140 may be configured to: draw a map for an environment, track an object, estimate a speed of the object, and the like.

The route control system 142 is configured to determine a driving route of the vehicle 100. In some embodiments, the route control system 142 may determine the driving route of the vehicle 100 with reference to data from the sensor 138, the GPS 122, and one or more predetermined maps.

The obstacle avoidance system 144 is configured to recognize, evaluate, and avoid or bypass, in another manner, a potential obstacle in the environment of the vehicle 100.

Certainly, for example, the control system 106 may add or alternatively include components in addition to those shown and described. Alternatively, the control system 106 may not include some of the foregoing components.

The vehicle 100 interacts with an external sensor, another vehicle, another computer system, or a user by using the peripheral device 108. The peripheral device 108 may include a wireless communication system 146, a vehicle-mounted computer 148, a microphone 150, and/or a speaker 152.

In some embodiments, the peripheral device 108 provides a mechanism for a user of the vehicle 100 to interact with the user interface 116. For example, the vehicle-mounted computer 148 may provide information to the user of the vehicle 100. The user interface 116 may further operate the vehicle-mounted computer 148 to receive user input. The vehicle-mounted computer 148 may perform operations through a touchscreen. In another case, the peripheral device 108 may provide a means for the vehicle 100 to communicate with another device located in the vehicle. For example, the microphone 150 may receive audio (for example, a voice command or another audio input) from the user of the vehicle 100. Similarly, the speaker 152 may output audio to the user of the vehicle 100.

The wireless communication system 146 may wirelessly communicate with one or more devices directly or through a communication network. In an embodiment of this application, the wireless communication system 146 may include a telematics box (T-Box). The T-Box may be installed in a place that is inside the vehicle 100 and that is not easily touched by a human hand, for example, installed under a dash board, under a glovebox, or under a trunk. The T-Box is mainly responsible for communication between the vehicle 100 and an internet of vehicles service platform. For example, the T-Box may use 3G cellular communication such as code division multiple access (CDMA), a global system for mobile communications (GSM), a general packet radio service (GPRS) technology, or 4G cellular communication such as long term evolution (LTE), or 5G cellular communication. The wireless communication system 146 may communicate with a wireless local area network (WLAN) through Wi-Fi. In some embodiments, the T-Box may further directly communicate with a device by using another communication protocol such as an infrared link, Bluetooth, or ZigBee, for example, communicate with another device such as a vehicle and/or a roadside unit.

The power supply 110 may provide power to various components of the vehicle 100. In an embodiment, the power supply 110 may be a rechargeable lithium-ion or lead-acid battery. One or more battery packs of the battery may be configured to provide power to the various components of the vehicle 100. In some embodiments, the power supply 110 and the energy source 119 may be implemented together, for example, as manners in some pure electric vehicles.

Some or all of functions of the vehicle 100 are controlled by the computer system 112. The computer system 112 may include at least one processor 123. The processor 123 executes instructions 125 stored in a non-transitory computer-readable medium such as a memory 124. The computer system 112 may alternatively be a plurality of computing devices that control an individual component or a subsystem of the vehicle 100 in a distributed manner.

The processor 123 may be any conventional processor, such as a commercially available central processing unit (CPU). In an embodiment, the processor may be a dedicated device, for example, an application-specific integrated circuit (ASIC) or another hardware-based processor. Although FIG. 1 functionally illustrates other elements of the processor, the memory, and the computer system 112 in a same block, a person of ordinary skill in the art should understand that the processor, the computer, or the memory may actually include a plurality of processors, computers, or memories that may or may not be stored in a same physical housing. For example, the memory may be a hard disk drive or another storage medium located in a housing different from that of the computer system 112. Therefore, a reference to the processor or the computer will be understood as including a reference to a set of processors, computers, or memories that may or may not operate in parallel. Different from using a single processor to perform the operations described herein, some components such as a steering component and a deceleration component may include respective processors. The processor performs only computation related to a component-specific function.

In various aspects described herein, the processor may be located far away from the vehicle and perform wireless communication with the vehicle. In another aspect, some of processes described herein are performed on a processor disposed inside the vehicle, while others are performed by a remote processor. The processes include necessary operations for performing a single operation.

In some embodiments, the memory 124 may include the instructions 125 (for example, program logics), and the instructions 125 may be executed by the processor 123 to perform various functions of the vehicle 100, including the functions described above. The memory 124 may also include additional instructions, including instructions used to send data to, receive data from, interact with, and/or control one or more of the travel system 102, the sensor system 104, the control system 106, and the peripheral device 108.

In addition to the instructions 125, the memory 124 may further store data, such as a road map, route information, and a position, a direction, a speed, and other such vehicle data of the vehicle, and other information. Such information may be used by the vehicle 100 and the computer system 112 when the vehicle 100 operates in an autonomous mode, a semi-autonomous mode, and/or a manual mode.

The user interface 116 is used to provide information for or receive information from the user of the vehicle 100. In an embodiment, the user interface 116 may include one or more input/output devices in a set of peripheral devices 108, for example, the wireless communication system 146, the vehicle-mounted computer 148, the microphone 150, and the speaker 152.

The computer system 112 may control the functions of the vehicle 100 based on input received from various subsystems (for example, the travel system 102, the sensor system 104, and the control system 106) and from the user interface 116. For example, the computer system 112 may use input from the control system 106 to control the steering unit 132 to avoid an obstacle detected by the sensor system 104 and the obstacle avoidance system 144. In some embodiments, the computer system 112 may operate to provide control over many aspects of the vehicle 100 and the subsystems of the vehicle 100.

In an embodiment, one or more of the foregoing components may be installed separately from or associated with the vehicle 100. For example, the memory 124 may be partially or completely separated from the vehicle 100. The foregoing components may be communicatively coupled together in a wired and/or wireless manner.

In an embodiment, the foregoing components are merely examples. In actual application, components in the foregoing modules may be added or deleted according to an actual requirement. FIG. 1 should not be understood as a limitation on this embodiment of this application.

An autonomous vehicle traveling on a road, for example, the vehicle 100, may recognize an object in an ambient environment of the autonomous vehicle, to determine to adjust a current speed. The object may be another vehicle, a traffic control device, or an object of another type. In some examples, each recognized object may be considered independently, and features of each object, such as a current speed of the object, an acceleration of the object, and a spacing between the object and the vehicle, may be used to determine a speed to be adjusted by the autonomous vehicle.

In an embodiment, the autonomous vehicle 100 or a computing device (for example, the computer system 112, the computer vision system 140, or the memory 124 in FIG. 1) associated with the autonomous vehicle 100 may predict behavior of the recognized object based on the features of the recognized object and a status (for example, traffic, rain, or ice on a road) of the ambient environment. In an embodiment, each recognized object depends on behavior of each other, and therefore, all the recognized objects may be considered together to predict behavior of a single recognized object. The vehicle 100 can adjust the speed of the vehicle 100 based on the predicted behavior of the recognized object. In other words, the autonomous vehicle can determine, based on the predicted behavior of the object, a specific stable state (for example, acceleration, deceleration, or stop) to which the vehicle needs to be adjusted. In this process, another factor, for example, a transverse position of the vehicle 100 on a road on which the vehicle 100 runs, a curvature of the road, or proximity between static and dynamic objects may also be considered, to determine the speed of the vehicle 100.

In addition to providing an instruction for adjusting the speed of the autonomous vehicle, the computing device may provide an instruction for modifying a steering angle of the vehicle 100, so that the autonomous vehicle can follow a given track and/or maintain a safe horizontal distance and a safe vertical distance from an object (for example, a car on a neighboring lane of the road) near the autonomous vehicle.

The vehicle 100 may be a car, a truck, a motorcycle, a bus, a boat, an airplane, a helicopter, a lawn mower, a recreational vehicle, a playground vehicle, a construction device, a trolley, a golf cart, a train, a handcart, or the like. This is not limited in embodiments of this application.

After the vehicle 100 is described, the following describes in detail the telematics box T-Box in the vehicle 100 in this application.

The T-Box may be internally connected to a controller area network bus (CAN-Bus) of the vehicle 100 to transmit instructions and information, and may be externally interconnected to another device through a cloud platform. The T-Box is a link for information exchange inside and outside the vehicle. For example, the T-Box is used as a wireless gateway to provide a remote communications interface for the vehicle 100, and may provide services such as travel data collection, driving track recording, vehicle fault monitoring, vehicle remote control (for example, locking and unlocking, air conditioner control, vehicle window control, engine torque limitation, and engine start-stop), driving behavior analysis, and 4G wireless hotspot analysis.

In addition, the T-Box is connected to the power supply 110 in the vehicle 100, and a backup battery is installed inside the T-Box. The power supply 110 is configured to supply power to the T-Box in a normal case, and the backup battery is always in a standby state in this case. The backup battery may be configured to supply power to the T-Box in a special case, to implement a function of communication between the T-Box and another device. For example, when a voltage of the power supply 110 drops (for example, when the power supply 110 is damaged or a harness falls off due to ignition or a collision), switching is performed to the backup battery for power supply, to implement an emergency call function or a data uploading function of the T-Box.

Figure 2:
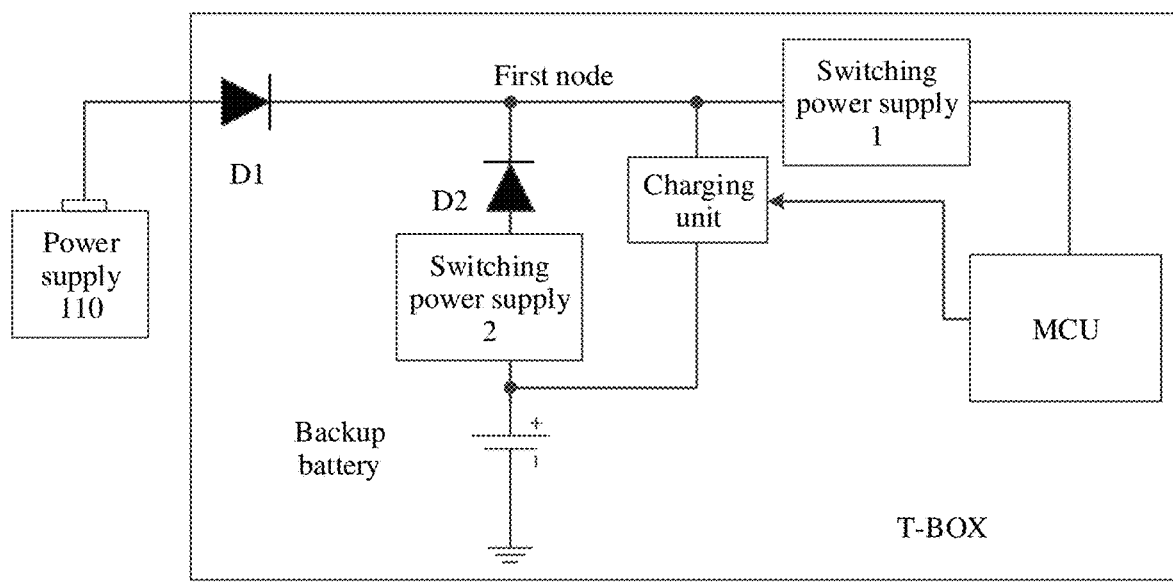
FIG. 2 is a schematic diagram of a structure of a T-Box according to an embodiment of this application.

The T-Box shown in FIG. 2 is used as an example. The T-Box may include a micro controller unit (MCU), a switching power supply 1, a switching power supply 2, a charging unit, a backup battery, and two diodes D1 and D2. The MCU is connected to a first node through the switching power supply 1. The power supply 110 of the vehicle 100 is connected to the first node through the diode D1. A positive electrode end of the backup battery is connected to the first node through the diode D2 and the switching power supply 2 in sequence, and a negative electrode end of the backup battery is connected to a ground end. The charging unit is connected between the first node and the positive electrode end of the backup battery. The MCU is also connected to the charging unit. Specifically, in a normal case, the switching power supply 1 is on, the switching power supply 2 is off, and the diode D1 is conducted. A current of the power supply 110 supplies power to the MCU after passing through the diode D1 and the switching power supply 1. When the power supply 110 is unavailable, the switching power supply 1 is on, the switching power supply 2 is on, and the diode D2 is conducted. The current of the backup battery supplies power to the MCU after passing through the diode D2 and the switching power supply 1. In addition, when the power supply 110 supplies power to the MCU, the current of the power supply 110 may also pass through the diode D1 to reach the charging unit, and the MCU may control the charging unit to charge the backup battery.

The backup battery is rarely used at the normal case. However, due to self-leakage and consumption of a standby static current, the backup battery needs to be charged in time. At the same time, the backup battery gradually ages as use time passes by, which shortens its life. After the backup battery is fully charged, a capacity that can be used decreases gradually. To ensure that the backup battery can normally supply power to the T-Box in a special case, there needs to be a specific requirement on a life or power of the backup battery. For example, in an emergency call (E-CALL) regulation, a life requirement of a backup battery is to maintain a call for at least 10 minutes and a standby state for at least 1 hour at normal temperature. Based on estimation of standby power of the T-Box, about 500 mAh@3.2 V power is required.

In the T-Box, commonly used backup batteries mainly include a rechargeable nickel metal hydride battery, a lithium battery, and the like. A life cycle of the vehicle 100 is generally 15 years, but a life of a backup battery of 1000 mAh (milliamperes hour) defined in the foregoing E-CALL regulation is only 5 to 7 years. Therefore, the backup battery cannot meet a life requirement of a full life cycle of the vehicle 100. The T-Box needs to periodically detect the life of the backup battery, so that when the life reaches a threshold, the T-Box can report an end-of-life condition of the backup battery in time, to remind a vehicle owner to replace the backup battery with a new one. Currently, detecting internal resistance of a battery is a commonly used method for battery life detection.

Figure 3:
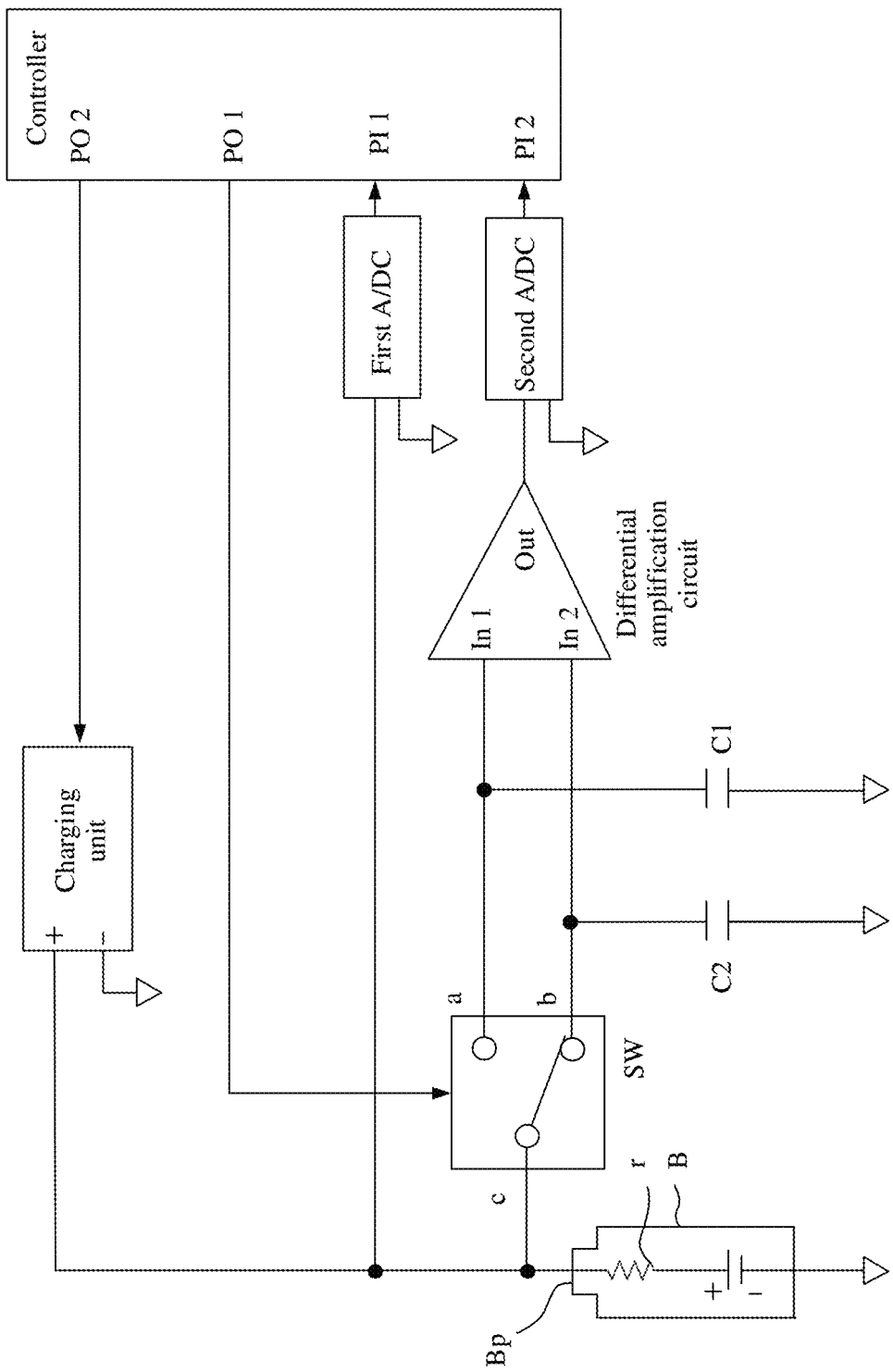
FIG. 3 is a schematic diagram of a structure of an internal resistance detection circuit in the conventional technology.

FIG. 3 is an internal resistance detection circuit of a battery according to the conventional technology. The circuit includes a battery B, a charging unit, a controller, a differential amplification circuit, a switching switch SW, a first capacitor C1, and a second capacitor C2. A first output end PO 1 of the controller is connected to the switching switch SW, and is configured to control switching of the switching switch. An input end of the charging unit is connected to a second output end PO 2 of the controller, a positive electrode charging end of the charging unit is connected to a Bp end of the battery B, and a negative electrode charging end of the charging unit is connected to a ground end. A first end a of the switching switch SW is connected to a first input end In 1 of the differential amplification circuit, a second end b of the switching switch SW is connected to a second input end In 2 of the differential amplification circuit, and a third end c of the switching switch SW is connected to the Bp end of the battery B. A first capacitor C1 is connected between the first input end In 1 of the differential amplification circuit and the ground end, and a second capacitor C2 is connected between the second input end In 2 of the differential amplification circuit and the ground end. A first input end PI 1 of the controller is connected to the Bp end of the battery B by using a first (analog/digital converter, ADC). An output end Out of the differential amplification circuit is connected to a second input end PI 2 of the controller by using a second ADC.

In an embodiment, a process in which the detection circuit shown in FIG. 3 detects internal resistance of the battery B is as follows: S01: the controller switches the switching switch SW to ca, and controls the charging unit to charge the battery B by using a charging current Ic, and the battery charges the first capacitor C1 until a voltage is stable. In this case, the voltage of the first capacitor C1 is equivalent to a voltage (represented as V1) at the Bp end when the battery B is charged, and the voltage is output to the first input end In 1 of the differential amplification circuit. S02: the controller turns off the charging unit, and switches the switching switch SW to cb, and the battery B charges the second capacitor C2 until a voltage is stable. In this case, the voltage of the second capacitor C2 is equivalent to a voltage (represented as V2) at the Bp end when the battery B has no load, and the voltage is output to the second input end In 2 of the differential amplification circuit. S03: the differential amplification circuit compares and amplifies the input voltages V1 and V2, and the second ADC performs analog-to-digital conversion on a voltage output from the output end Out and transmits a converted voltage to the controller. S04: the controller determines the internal resistance of the battery by using the following formula (1). In the formula, r represents the internal resistance of the battery, Ic represents the charging current, A represents an amplification multiple in the differential amplification circuit, and V1−V2 represents a voltage output by the differential amplification circuit.

$$r=(V1-V2)/(A \times Ic) \tag{1}$$

Figure 4B:
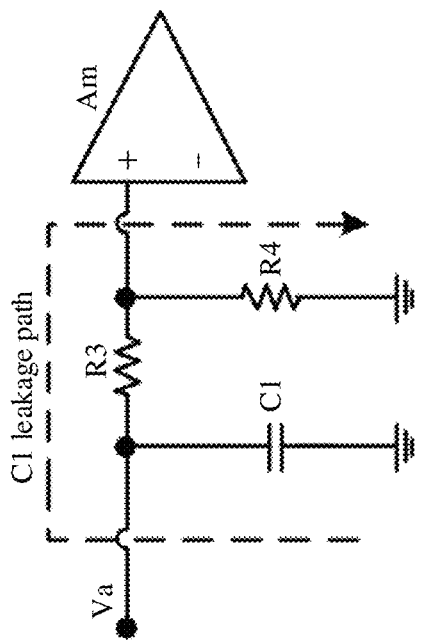
FIG. 4(a) and FIG. 4(b) are a schematic diagram of a differential amplification circuit and a leakage path.
Figure 4A:
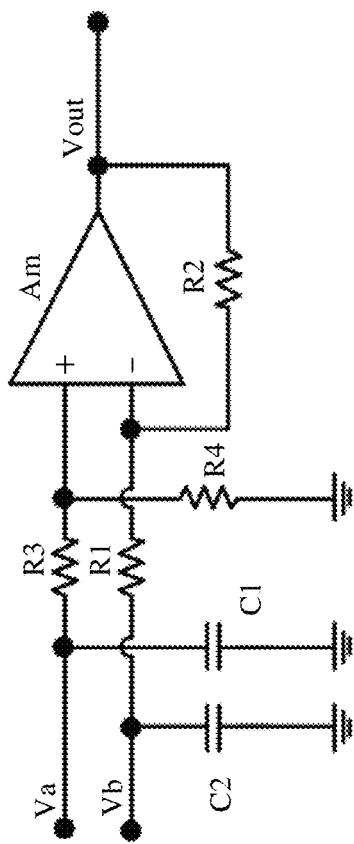

A structure of the differential amplification circuit in FIG. 3 is a structure of a classic differential amplification circuit. Specific structures of the first capacitor C1, the second capacitor C2, and the differential amplification circuit may be shown in FIG. 4(a), and a leakage path of the differential amplification circuit in the foregoing internal resistance detection process is described in detail. Refer to FIG. 4(a). The differential amplification circuit includes an operational amplifier Am and a resistor R1 to a resistor R4. One end of R1 is used as the first input end In 1 of the differential amplification circuit, and the other end is connected to a negative-phase input end of the operational amplifier Am. R2 is connected between the negative-phase input end of the operational amplifier Am and an output end of the operational amplifier Am. One end of R3 is used as the second input end In 2 of the differential amplification circuit, and the other end is connected to a positive-phase input end of the operational amplifier Am. R4 is connected between the positive-phase input end of the operational amplifier Am and a ground end. In FIG. 4(a) and FIG. 4(b), Va represents a voltage at the second input end In 2 of the differential amplification circuit, Vb represents a voltage at the first input end In 1 of the differential amplification circuit, Vout represents a voltage at the output end of the differential amplification circuit, and Vout may be determined by using the following formula (2):

$$Vout=(Vb-Va) \times R2/R1, \text{ when } R1=R3, R2=R4 \tag{2}$$

It can be learned from the formula (1) that the output voltage of the differential amplification circuit is Vout=A×Ic×r, where A=R2/R1. It is assumed that the backup battery on the T-Box is a lithium battery. A minimum internal resistance of the lithium battery is 20 milliohms (mΩ), and a maximum internal resistance of the lithium battery is about 300 mΩ. To ensure ADC detection precision, the output voltage Vout of the differential amplification circuit should be greater than 0.1 V. It is assumed that the charging current Ic is 1 A, and the amplification multiple A is 10.

It is assumed that in the foregoing operation S01, the backup battery B charges the first capacitor C1 to Va. After the switching switch SW is switched to cb in the foregoing operation S02, the first capacitor C1 leaks a current to the ground through R3 and R4 (it is assumed that operational amplifier input impedance is much greater than a sum of R3 and R4), as shown in FIG. 4(b). Correspondingly, a relationship between a voltage $V_{C1}$ of the first capacitor C1 and time is shown in the following formula (3):

$$V_{C1} = Va \times e^{\frac{-t}{(R3+R4) \times C1}} \quad (3)$$

Due to a loop stability requirement of the differential operational amplifier, R2 is preferably less than 100 KΩ. In addition, because R2≥10×R1 and R1 is less than 10 KΩ, R1+R2<110 KΩ. It is assumed that C1 is 1 μF, the following may be obtained by using the formula (3):

1 ms later, $V_{C1}$=Va×99%; and
10 ms later, $V_{C1}$=Va×90%.

It is assumed that a voltage of the backup battery is 3 V and the internal resistance is 20 mΩ. When the backup battery is charged with a current of 1 A, a voltage drop generated on the internal resistance of the backup battery is 20 mV. It can be learned from the foregoing calculation result that, 1 ms (millisecond) later, the voltage lost by the first capacitor C1 is 1%, namely, 30 mV, which exceeds a voltage (10 millivolts or mV) that needs to be detected. In other words, if the detection circuit completes detection within 1 ms, an error of the detection circuit exceeds 100%. In addition, due to impact of a circuit delay, for example, it takes about 10 ms for the charging unit to start and become stable, it is difficult to complete the entire process within 1 ms. Similarly, a similar problem exists in a Vb channel. Therefore, this solution is difficult to implement and has a large error.

Figure 5:
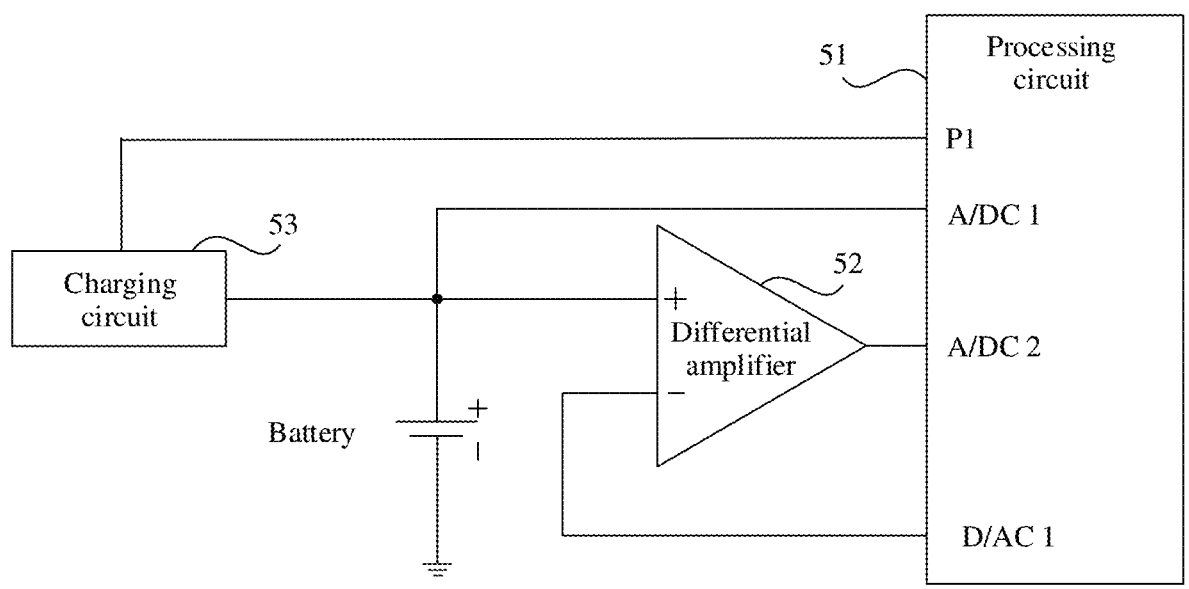
FIG. 5 is a schematic diagram of a structure of a first apparatus for detecting internal resistance of a battery according to an embodiment of this application.

Based on this, an embodiment of this application provides an apparatus for detecting internal resistance of a battery. As shown in FIG. 5, the apparatus includes a processing circuit 51, a differential amplifier 52, and a charging circuit 53. A positive electrode end of the battery is separately connected to a first ADC interface of the processing circuit 51, a first input end of the differential amplifier 52, and the charging circuit 53, and a negative electrode end of the battery is connected to a ground end. A second ADC interface of the processing circuit 51 is connected to an output end of the differential amplifier 52, a digital-to-analog converter (digital/analog converter, DAC) interface of the processing circuit 51 is connected to a second input end of the differential amplifier 52, and a communications interface of the processing circuit 51 is connected to the charging circuit 53. In FIG. 5, ADC 1 represents the first ADC interface, ADC 2 represents the second ADC interface, DAC 1 represents the DAC interface, and P1 represents the communications interface.

In an embodiment of this application, a voltage of the battery detected by the processing circuit 51 is referred to as a detection voltage, for example, a first detection voltage and a second detection voltage below. A voltage output by the differential amplifier 52 or a voltage output by the differential amplifier 52 and detected by the processing circuit 51 is referred to as an output voltage, for example, a first output voltage and a second output voltage below. A voltage compared with the voltage of the battery is referred to as a comparison voltage, for example, a first comparison voltage below. In actual application, the detection voltage, the output voltage, and the comparison voltage may also have other different names. This is not limited in this embodiment of this application.

Figure 6:
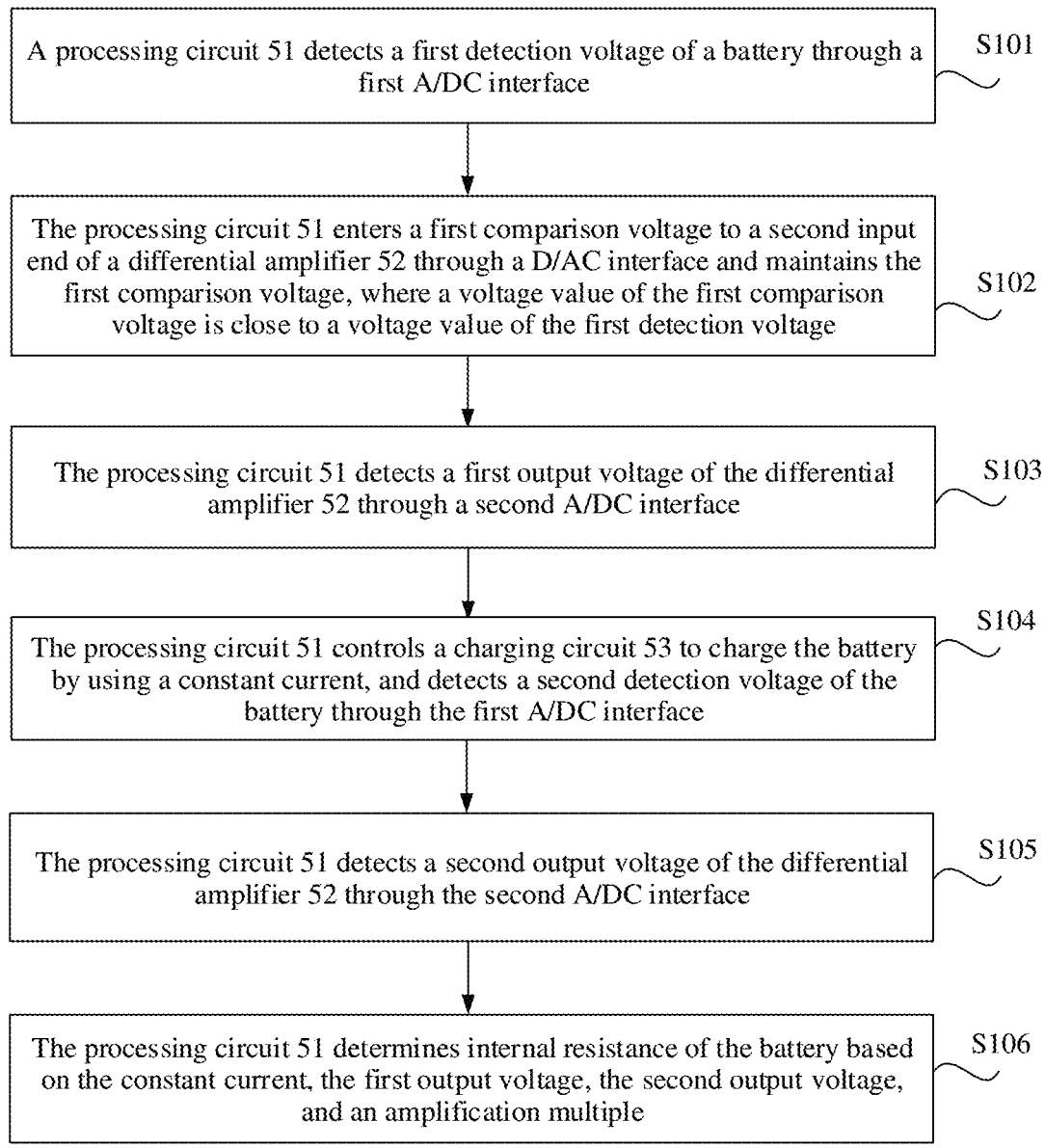
FIG. 6 is a schematic flowchart of a method for detecting internal resistance of a battery according to an embodiment of this application.

Based on the detection apparatus provided in FIG. 5, an embodiment of this application provides a method for internal resistance of a battery. As shown in FIG. 6, the method may include the following operations S101 to S106.

Operation S101: the processing circuit 51 detects a first detection voltage of the battery by using the first ADC interface.

The battery may be a nickel metal hydrogen battery, a nickel cadmium alkaline battery, a lithium battery, a lead battery, or the like. The battery may be installed in the T-Box and used as a backup battery in the T-Box, or certainly may be used as a backup battery of another device such as a mobile phone or an intelligent wearable device. The first detection voltage may be a no-load voltage of the battery. The no-load voltage is a voltage of the battery when the battery does not supply power to a load or a voltage of the battery when the battery is not charged. For example, a voltage when the battery is used as a backup battery in the T-Box and does not supply power to the T-Box is the no-load voltage.

In addition, an ADC interface of the processing circuit 51 has an analog-to-digital conversion function, and the ADC interface may convert an analog voltage into a digital voltage. The first ADC interface of the processing circuit 51 is connected to the positive electrode end of the battery, so that the processing circuit 51 may convert an analog voltage at the positive electrode end of the battery into a digital voltage through the first ADC interface, that is, the processing circuit 51 may detect the voltage of the battery through the first ADC interface.

In an embodiment, when the processing circuit 51 needs to charge the battery, the processing circuit 51 may detect the no-load voltage of the battery through the first ADC interface before charging the battery, to obtain the first detection voltage. Alternatively, the processing circuit 51 continuously detects the no-load voltage of the battery through the first ADC interface, and when the detected no-load voltage is in a preset no-load voltage range, reads the detected no-load voltage to obtain the first detection voltage. That is, the first detection voltage may be a no-load voltage of the battery before charging, or a no-load voltage of the battery in a preset voltage range.

It should be noted that the preset no-load voltage range may be preset. When the no-load voltage of the battery is in the preset no-load voltage range, the no-load voltage of the battery is stable, so that accuracy of the detected no-load voltage is high. Preset no-load voltage ranges corresponding to different batteries may be the same or may be different. For example, when the battery is a lithium iron phosphate battery of the lithium battery, the preset no-load voltage range may be [3.3 V, 3.35 V].

Operation S102: the processing circuit 51 enters a first comparison voltage to the second input end of the differential amplifier 52 through the DAC interface and maintains the first comparison voltage, where a voltage value of the first comparison voltage is close to a voltage value of the first detection voltage.

The DAC interface of the processing circuit 51 has a digital-to-analog conversion function, and the DAC interface may convert a digital voltage into an analog voltage.

The DAC interface of the processing circuit 51 is connected to the second input end of the differential amplifier 52, so that the analog voltage may be entered to the second input end of the differential amplifier 52 through the DAC interface.

In an embodiment, the processing circuit 51 may set the voltage value of the first comparison voltage based on the voltage value of the first detection voltage. The voltage values of the first comparison voltage and the first detection voltage may be equal, or a difference between the voltage values of the first comparison voltage and the first detection voltage is close to zero. The first comparison voltage may be a digital voltage. After converting the first comparison voltage into an analog voltage through the DAC interface, the processing circuit 51 enters the analog voltage to the second input end of the differential amplifier 52 and maintains the analog voltage. For the differential amplifier 52, the first input end of the differential amplifier 52 is connected to the positive electrode end of the battery, so that the first input end of the differential amplifier 52 may receive an analog voltage (that is, an analog voltage corresponding to the first detection voltage) at the positive electrode end of the battery. The second input end of the differential amplifier 52 may receive an analog voltage (that is, an analog voltage corresponding to the first comparison voltage) that is entered by the processing circuit 51 through the DAC interface. After amplifying a difference between the analog voltage corresponding to the first detection voltage and the analog voltage corresponding to the first comparison voltage, the differential amplifier 52 outputs an amplified first difference analog voltage from the output end of the differential amplifier 52.

It should be noted that, theoretically, assuming that no deviation exists between analog-to-digital conversion and digital-to-analog conversion of the processing circuit 51, and no offset voltage exists between the two input ends of the differential amplifier 52, when the first detection voltage is equal to the first comparison voltage, the analog voltage corresponding to the first detection voltage is also equal to the analog voltage corresponding to the first comparison voltage. Therefore, the amplified first difference analog voltage output by the differential amplifier 52 from the output end is equal to 0.

However, in an embodiment, any electronic component has a deviation. Assuming that a deviation of the processing circuit 51 between analog-to-digital conversion and digital-to-analog conversion is $\Delta V$, if the analog voltage corresponding to the first detection voltage detected by the processing circuit 51 is represented as V1, and the analog voltage corresponding to the first comparison voltage entered by the processing circuit 51 to the second input end of the differential amplifier 52 is represented as V2, $V1-V2=\Delta V$. Assuming that the offset voltage between the two input ends of the differential amplifier 52 is Voffset, an amplification multiple of the differential amplifier 52 is K, and a first difference analog voltage output by the differential amplifier 52 is represented as V3, a relationship between V3 and V1 and V2 may be represented by using the following formula (I):

$$V3=(\Delta V+Voffset)\times K=(V1-V2+Voffset)\times K \quad (I)$$

It should be noted that the first input end of the differential amplifier 52 may be a positive-phase input end, and the second input end may be a negative-phase input end. Alternatively, the first input end of the differential amplifier 52 is a negative-phase input end, and the second input end may be a positive-phase input end. Related descriptions in FIGS. 5 and S102 are described by using an example in which the first input end is a positive-phase input end and the second input end is a negative-phase input end.

Operation S103: the processing circuit 51 detects a first output voltage of the differential amplifier 52 through the second ADC interface.

In an embodiment, the second ADC interface of the processing circuit 51 is connected to the output end of the differential amplifier 52. When the differential amplifier 52 outputs the first difference analog voltage, the processing circuit 51 may convert the first difference analog voltage into a digital voltage through the second ADC interface, to obtain the first output voltage.

In an embodiment, in a process in which the processing circuit 51 detects the first output voltage through the second ADC interface, the first comparison voltage may be finely adjusted, so that the detected first output voltage is in a preset output voltage range [Vc, Vd]. Vc may be referred to as a first preset output voltage, and Vd may be referred to as a second preset output voltage. Specifically, the following is included: If the output voltage detected by the processing circuit 51 through the second ADC interface is less than the first preset voltage Vc, the processing circuit 51 may enable, by increasing the first comparison voltage, the output voltage detected through the second ADC interface to be greater than or equal to the first preset voltage Vc; or, if the output voltage detected by the processing circuit 51 through the second ADC interface is greater than the second preset voltage Vd, the processing circuit 51 may enable, by decreasing the first comparison voltage, the output voltage detected through the second ADC interface to be less than or equal to the second preset output voltage Vd. In the foregoing optional implementation, the processing circuit 51 finely adjusts the first comparison voltage, so that the first output voltage detected through the second ADC interface is in the preset output voltage range. This can reduce impact of the first output voltage on a detection range of the internal resistance of the battery, and improves precision of detecting the internal resistance of the battery.

It should be noted that the preset output voltage range [Vc, Vd] may be preset, and the first preset voltage Vc in the preset output voltage range is greater than 0.

For example, when the first difference amplification voltage is represented as V3, the first output voltage detected by the processing circuit 51 may also be represented as V3, and the relationship between the deviation $\Delta V$ of the processing circuit 51 between analog-to-digital conversion and digital-to-analog conversion and the offset voltage Voffset between the two input ends of the differential amplifier 52 may be represented by using the foregoing formula (I).

Operation S104: the processing circuit 51 controls the charging circuit 53 to charge the battery by using a constant current, and after the charging is completed, detects a second detection voltage of the battery through the first ADC interface.

A communications interface of the processing circuit 51 is connected to the charging circuit 53. The processing circuit 51 may control the charging circuit 53 through the communications interface, for example, may enable the charging circuit 53, and set a value of the constant current when the charging circuit 53 is charged. In an embodiment, the constant current may be 0 A to 1 A (ampere). For example, the constant current may be 10 mA, 100 mA, 200 mA, or the like.

In addition, the first ADC interface of the processing circuit 51 is connected to the positive electrode end of the battery, so that the processing circuit 51 may convert an analog voltage at the positive electrode end of the battery into a digital voltage through the first ADC interface, that is, the processing circuit 51 may detect the voltage of the battery through the first ADC interface.

In an embodiment, the processing circuit 51 may control the charging circuit 53 to charge the battery by using a constant current. The processing circuit 51 may continuously detect the voltage of the battery through the first ADC interface in a charging process. That is, the processing circuit 51 may continuously convert the analog voltage at the positive electrode end of the battery into the digital voltage through the first ADC interface. When the converted digital voltage is stable and does not change, the processing circuit 51 may read the detected voltage to obtain the second detection voltage. Alternatively, after the charging circuit 53 charges the battery by using the constant current for a period of time, the processing circuit 51 converts the analog voltage at the positive electrode end of the battery into the digital voltage through the first ADC interface, to obtain the second detection voltage. For the differential amplifier 52, the first input end of the differential amplifier 52 is connected to the positive electrode end of the battery, so that the first input end of the differential amplifier 52 may receive an analog voltage (that is, an analog voltage corresponding to the second detection voltage) at the positive electrode end of the battery. The second input end of the differential amplifier 52 may receive the analog voltage (that is, the analog voltage corresponding to the first comparison voltage) that is entered by the processing circuit 51 through the DAC interface. After amplifying a difference between the analog voltage corresponding to the second detection voltage and the analog voltage corresponding to the first comparison voltage, the differential amplifier 52 outputs an amplified second difference analog voltage from the output end of the differential amplifier 52.

When the offset voltage between the two input ends of the differential amplifier 52 is Voffset, if the second difference analog voltage is represented as V3', and the analog voltage corresponding to the second detection voltage detected by the processing circuit 51 is V1', a relationship between V3' and V1' may be represented by using the following formula (II):

$$V3'=(V1'-V2+V\text{offset})\times K \quad \text{(II)}$$

Operation S105: the processing circuit 51 detects a second output voltage of the differential amplifier 52 through the second ADC interface.

In an embodiment, the second ADC interface of the processing circuit 51 is connected to the output end of the differential amplifier 52. When the differential amplifier 52 outputs the second difference analog voltage, the processing circuit 51 may convert the second difference analog voltage into a digital voltage through the second ADC interface, to obtain the second output voltage.

For example, when the second difference amplification voltage is represented as V3', the second output voltage detected by the processing circuit 51 may also be represented as V3', and the relationship between the deviation ΔV of the processing circuit 51 between analog-to-digital conversion and digital-to-analog conversion and the offset voltage Voffset between the two input ends of the differential amplifier 52 may be represented by using the foregoing formula (II).

Operation S106: the processing circuit 51 determines the internal resistance of the battery based on the constant current, the first output voltage, the second output voltage, and the amplification multiple.

When the processing circuit 51 obtains the first output voltage and the second output voltage through detection, the processing circuit 51 may determine the internal resistance of the battery based on the constant current, the first output voltage, the second output voltage, and the amplification multiple. Specifically, the processing circuit may determine the internal resistance of the battery by using the following formula (III). In the formula, r represents the internal resistance of the battery, I represents the constant current, K represents the amplification multiple, V3 represents the first output voltage, and V3' represents the second output voltage.

$$r=(V3'-V3)/(I\times K) \quad \text{(III)}$$

With reference to the foregoing formulas (I) and (II), the following describes in detail whether the internal resistance of the battery determined by the processing circuit 51 is affected by the deviation ΔV of the processing circuit 51 between analog-to-digital conversion and digital-to-analog conversion and the offset voltage Voffset between the two input ends of the differential amplifier 52.

In an embodiment, a formula (IV) may be obtained by subtracting the formula (I) from the formula (II). A difference between V1' and V1 in the formula (IV) is a voltage difference before and after the battery is charged. The voltage difference is equal to a product of the constant current I and the internal resistance r of the battery. The product of the constant current I and the internal resistance r of the battery is used to replace the difference between V1' and V1 in the formula (IV), to obtain a formula (V). The formula (III) is equivalent to the formula (V). Therefore, it can be learned that the internal resistance of the battery determined by the processing circuit 51 based on the constant current I, the first output voltage V3, the second output voltage V3', and the amplification multiple K is not affected by a deviation of an electronic component, so that accuracy of detecting the internal resistance of the battery is high.

$$(II)-(I)=V3'-V3=(V1'-V1)\times K \quad \text{(IV)}$$

$$V3'-V3=I\times r\times K \quad \text{(V)}$$

Figure 7:
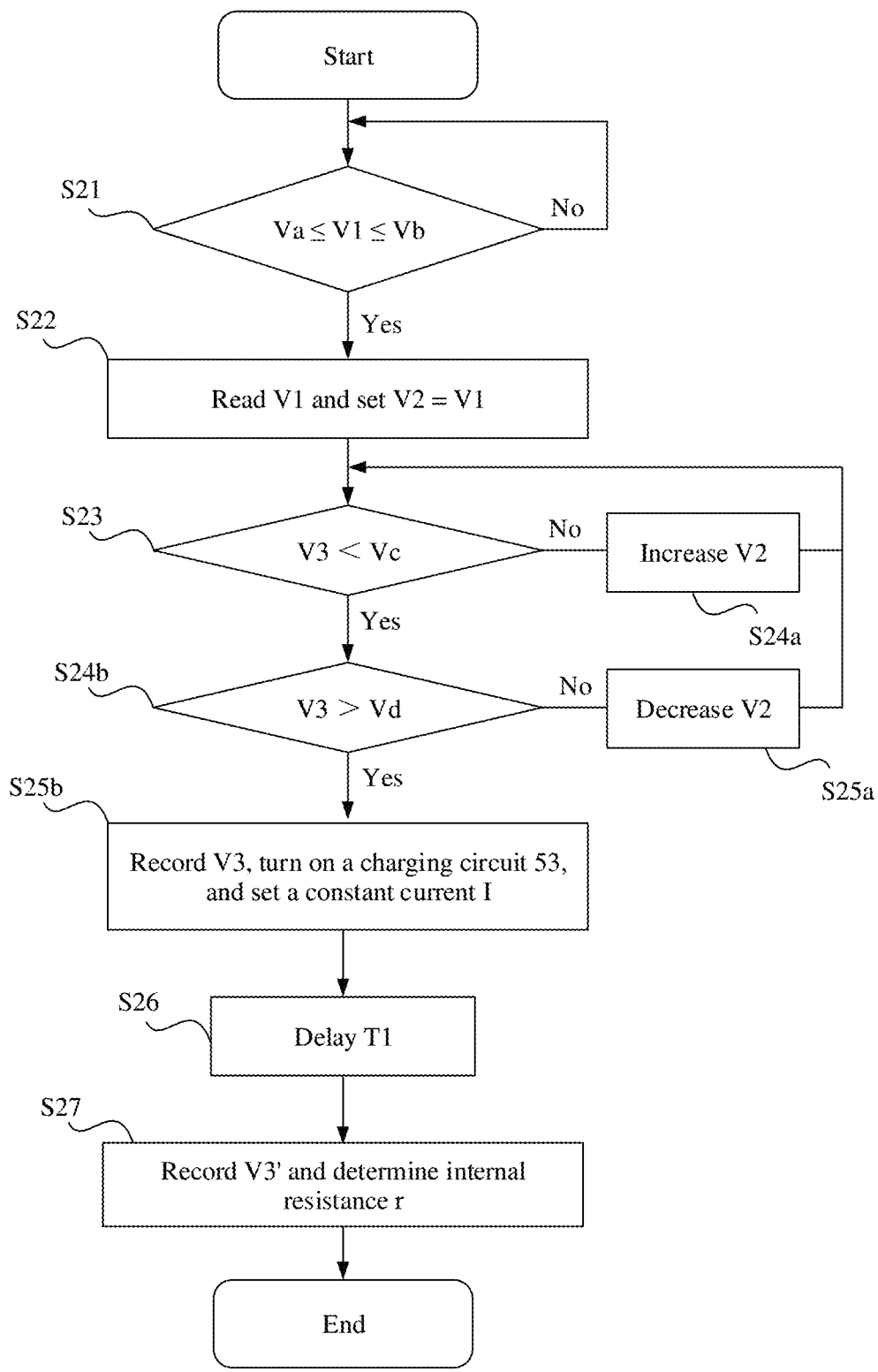
FIG. 7 is a schematic flowchart of another method for detecting internal resistance of a battery according to an embodiment of this application.

For ease of understanding, the following uses FIG. 7 as an example to describe operations performed by the processing circuit 51 in the method provided in this embodiment of this application. As shown in FIG. 7, the processing circuit 51 is configured to perform the following operations. S21: The processing circuit 51 determines whether the detected first detection voltage V1 belongs to a preset no-load voltage range [Va, Vb]; and if the detected first detection voltage V1 does not belong to the preset no-load voltage range [Va, Vb], performs continuous detection and determining; or if the detected first detection voltage V1 belongs to the preset no-load voltage range [Va, Vb], performs S22. S22: The processing circuit 51 reads the first detection voltage V1 and set the first comparison voltage V2=V1. S23: The processing circuit 51 determines whether the detected first output voltage V3 is greater than the first preset output voltage Vc; and if the detected first output voltage V3 is not greater than the first preset output voltage Vc, performs S24a; or if the detected first output voltage V3 is greater than the first preset output voltage Vc, performs S24b. S24a: The processing circuit 51 increases the first comparison voltage V2 and returns to S23. S24b: The processing circuit 51 determines whether the detected first output voltage V3 is less than a second preset output voltage Vd; and if the detected first output voltage V3 is not less than the second preset output voltage Vd, performs S25a; or if the detected first output voltage V3 is less than the second preset output voltage Vd, performs S25b. S25a: The processing circuit 51 reduces the first comparison voltage V2 and returns to S23. S25b: The processing circuit 51 records the first output voltage V3, turns on the charging circuit 53, and sets the constant current I. S26: The processing circuit 51 delays for a period of time T1. S27: The processing circuit 51 records the second output voltage V3' and determines the internal resistance r of the battery.

For example, as shown in Table 1, internal resistance of two batteries is separately detected by using the method for detecting internal resistance provided in embodiments of this application. Actual internal resistance of the two batteries is respectively 10 moh and 100 moh. First detection voltages V1 detected by the processing circuit 51 are respectively 442.55 mV and 444.69 mV. After the charging circuit is charged by using a constant current of 100 mA for a period of time, detected second detection voltages V2 are respectively 546.75 mV and 1440.45 mV. Simulated internal resistance of the two batteries determined by using the foregoing method is respectively 10.42 moh and 99.576 moh. Therefore, it can be learned that internal resistance detection errors of the two batteries are respectively 4.2% and −0.4%.

TABLE 1

| Actual internal resistance (moh) | First detection voltage V1 (mV) | Second detection voltage V2 (mV) | Simulated internal resistance (moh) | Error |
|---|---|---|---|---|
| 10 | 442.55 | 546.75 | 10.42 | 4.2% |
| 100 | 444.69 | 1440.45 | 99.576 | −0.4% |

When the T-Box detects the internal resistance of the backup battery by using the foregoing method for detecting the internal resistance, the T-Box may display a corresponding parameter or information on a display interface of a dashboard of the vehicle based on the internal resistance, to prompt the user whether the life of the backup battery ends, and further prompt the user to replace the backup battery in time. In an embodiment, when the detected internal resistance is greater than an internal resistance threshold (for example, the internal resistance threshold may be 300 moh), the T-Box may display, on the display interface, prompt information indicating that the life of the backup battery ends.

Figure 8:
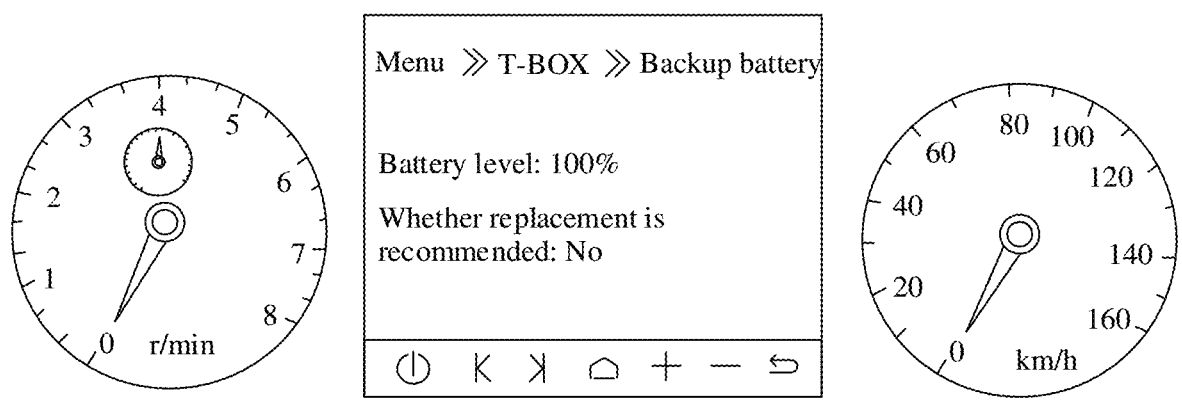
FIG. 8 is a diagram of a display interface of a backup battery in a T-box according to an embodiment of this application.

For example, the display interface of the dashboard of the vehicle is shown in FIG. 8. The display interface includes a rotation speed display panel (in r/min), a speed display panel (in km/h), and a menu display interface. The menu display interface may include a T-Box menu. The T-Box may include a backup battery submenu. The backup battery submenu may display related information such as a battery level of the backup battery and whether to recommend replacement of the backup battery. A toolbar may be provided below the menu display interface, and the following keys may be disposed in the toolbar: a switch key, a forward key, a back key, a main menu key, a volume up key, a volume down key, a backward key, and the like.

In the method for detecting the internal resistance provided in embodiments of this application, the first comparison voltage is set based on the first detection voltage before the battery is charged. The first comparison voltage is used as a reference voltage and is compared with the second detection voltage after the battery is charged for amplification, so that the internal resistance of the battery is determined based on an amplified voltage. In addition, the deviation of the differential amplifier 52 and the deviation between the ADC and the DAC can be canceled in a process of determining the internal resistance. This improves detection precision, and requires low precision of the differential amplifier 52 by the detection apparatus.

The foregoing mainly describes the method for detecting the internal resistance of the battery provided in embodiments of this application from a perspective of the processing circuit 51 in the detection apparatus. It may be understood that, to implement the foregoing functions, the processing circuit 51 includes a corresponding hardware structure and/or software module for performing each of the functions. A person skilled in the art should be easily aware that, in combination with structures and algorithm operations of the examples described in embodiments disclosed in this specification, this application can be implemented by a combination of hardware and computer software. Whether a function is executed by hardware or hardware driven by computer software depends on particular applications and design constraints of the technical solutions. A person skilled in the art may use different methods to implement the described functions for each particular application, but it should not be considered that the implementation goes beyond the scope of this application.

The following describes the detection apparatus provided in embodiments of this application from a perspective of each hardware structure in the detection apparatus. In the detection apparatus shown in FIG. 5, corresponding operations performed by the processing circuit 51, the differential amplifier 52, and the charging circuit 53 may include: The processing circuit 51 is configured to detect the first detection voltage of the battery through the first ADC interface, set the first comparison voltage based on the first detection voltage, enter the first comparison voltage to the second input end of the differential amplifier 52 through the DAC interface, and maintain the first comparison voltage, where the first detection voltage is equal to the first comparison voltage. The differential amplifier 52 is configured to compare the first detection voltage with the first comparison voltage and amplify the first detection voltage to output the first output voltage. The processing circuit 51 is further configured to detect the first output voltage through the second ADC interface. The processing circuit 51 is further configured to control the charging circuit 53 to charge the battery through the constant current, and detect the second detection voltage of the battery through the first ADC interface after the charging is completed. The differential amplifier 52 is further configured to compare the second detection voltage with the first comparison voltage and amplify the second detection voltage to output the second output voltage. The processing circuit 51 is further configured to detect the second output voltage through the second ADC interface. The processing circuit 51 is further configured to determine the internal resistance of the battery based on the constant current, the first output voltage, the second output voltage, and the amplification multiple.

Further, in the detection apparatus shown in FIG. 5, the communications interface in the processing circuit 51 may be a general purpose input/output (general purpose input output, GPIO) interface or a communication bus interface. The first ADC interface, the second ADC interface, and the DAC interface may have a plurality of possible implementations. The following separately describes different implementations.

Figure 9:
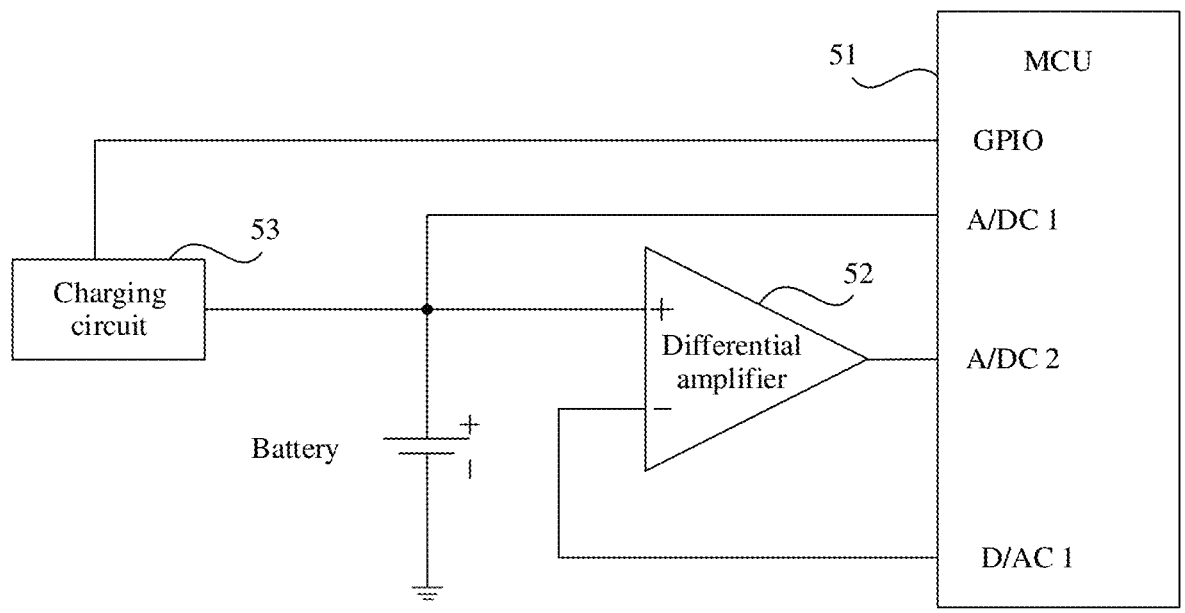
FIG. 9 is a schematic diagram of a structure of a second apparatus for detecting internal resistance of a battery according to an embodiment of this application.

In an embodiment, the processing circuit 51 may be a processing chip. For example, the processing chip may be a central processing unit, a micro controller unit (MCU), or the like. The processing chip includes an ADC and a DAC, that is, the processing chip has an analog-to-digital conversion function and a digital-to-analog conversion function, so that the processing chip may have an ADC interface and a DAC interface. For example, as shown in FIG. 9, the processing chip is an MCU, and a first ADC interface, a second ADC interface, a DAC interface, and a GPIO interface are disposed in the MCU. In FIG. 9, ADC 1 represents the first ADC interface, ADC 2 represents the second ADC interface, and DAC 1 represents the DAC interface. In the detection apparatus shown in FIG. 9, the MCU may perform S101 to S106 in the foregoing method embodiment.

In another embodiment, the processing circuit 51 may be a combination of a processing chip and a DAC, or a combination of a processing chip, an ADC, and a DAC. The processing chip may be a central processing unit, a micro controller unit MCU, or the like. The DAC may be a DAC chip or an established analog-to-digital conversion circuit. The ADC may be an ADC chip or an established analog-to-digital conversion circuit. When the processing circuit 51 is a combination of a processing chip and a DAC, the processing chip has an analog-to-digital conversion function, so that the processing chip has an ADC interface. An output end of the DAC may be used as the DAC interface of the processing circuit 51.

Figure 10A:
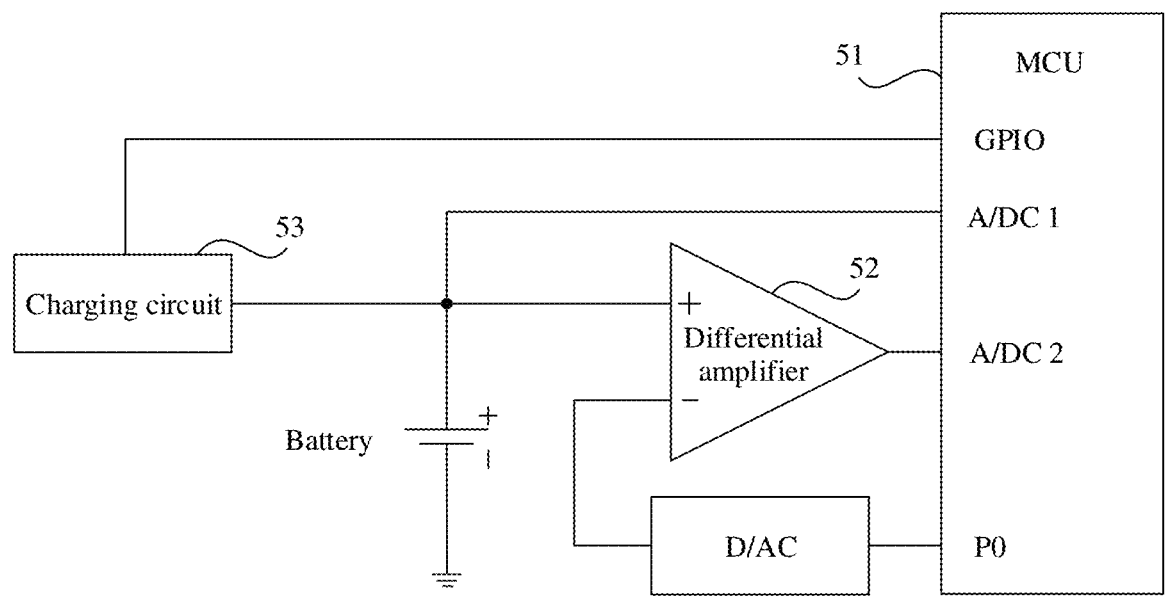
FIG. 10(a) and FIG. 10(b) are a schematic diagram of a structure of a third apparatus for detecting internal resistance of a battery according to an embodiment of this application.
Figure 10B:
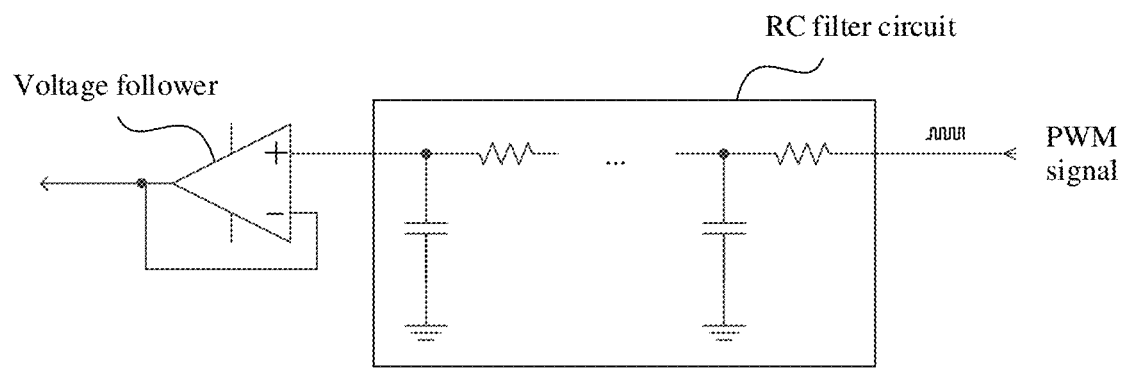

For example, as shown in FIG. 10(*a*) and FIG. 10(*b*), the processing chip is an MCU. A first ADC interface, a second ADC interface, a GPIO interface, and an output port P0 are disposed in the MCU. The output port P0 of the MCU is connected to an input end of a DAC, and an output end of the DAC is connected to a second input end of the differential amplifier 52. Descriptions are provided by using an example in which the DAC is an analog-to-digital conversion circuit in FIG. 10(*a*). The analog-to-digital conversion circuit may be shown in FIG. 10(*b*), and includes an N-order (N is a positive integer) RC filter circuit and a voltage follower. An input end of the N-order RC filter circuit is connected to the output port P0 of the MCU, an output end of the N-order RC filter circuit is connected to an input end of the voltage follower, and an output end of the voltage follower is used as an output end of the analog-to-digital conversion circuit. In an embodiment, the MCU may output a PWM signal through the output port P0. A direct current level is output after the PWM signal passes through the N-order RC filter circuit. The direct current level is entered to the second input end of the differential amplifier 52 after passing through the voltage follower. The voltage follower here can isolate a previous stage from a next stage and improve a voltage driving capability, so that stability of the N-order RC filter circuit is not affected by a load of the next stage. In addition, the MCU may adjust a magnitude of a voltage entered to the second input end of the differential amplifier 52 by adjusting a duty cycle of the output PWM signal, that is, increase or decrease the first comparison voltage by adjusting the duty cycle of the PWM signal. Specifically, in the detection apparatus shown in FIG. 10(*a*) and FIG. 10(*b*), the MCU may perform S101, S103, and S106 in the foregoing method embodiment. The MCU and the DAC jointly perform S102 in the foregoing method embodiment, that is, the MCU outputs the PWM signal based on the first comparison voltage, and the DAC converts the PWM signal into an analog signal and enters the analog signal to the second input end of the differential amplifier 52.

Further, for the detection apparatus provided in any one of FIG. 5, FIG. 9, and FIG. 10(*a*) and FIG. 10(*b*), some components in the detection apparatus may be integrated into an integrated circuit (integrated circuit, IC) chip, or all components in the detection apparatus may be integrated into an IC chip. By integrating some or all components into an IC chip, a peripheral circuit of the IC chip can be simplified, and an integration level can be improved.

Figure 11:
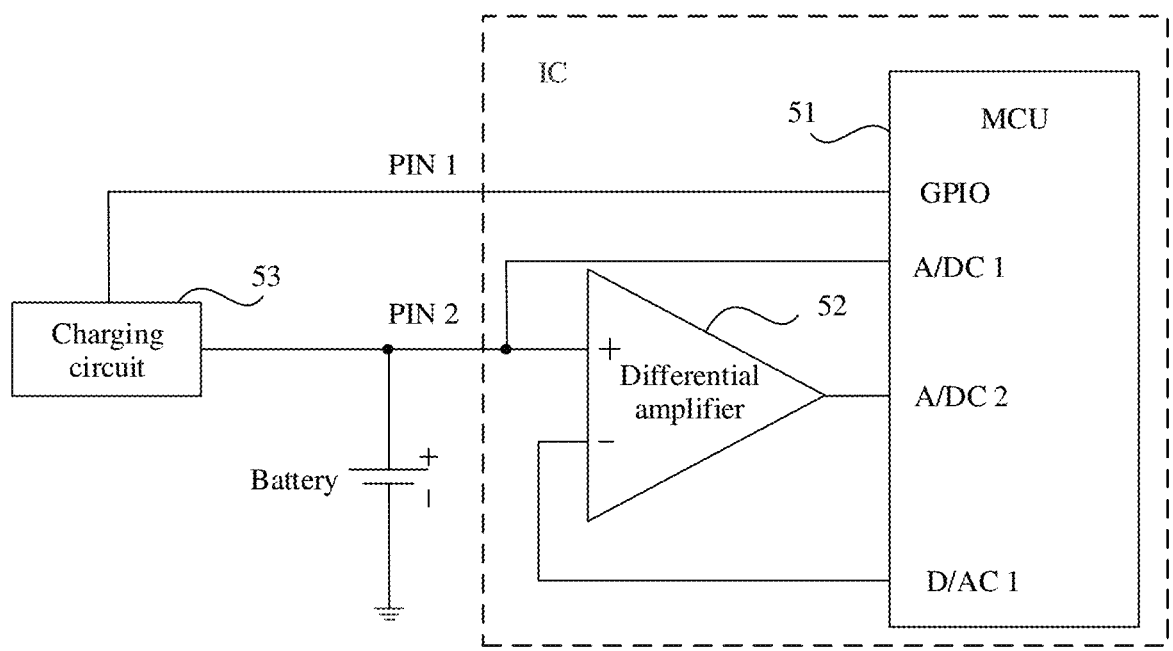
FIG. 11 is a schematic diagram of a structure of a fourth apparatus for detecting internal resistance of a battery according to an embodiment of this application.
Figure 12:
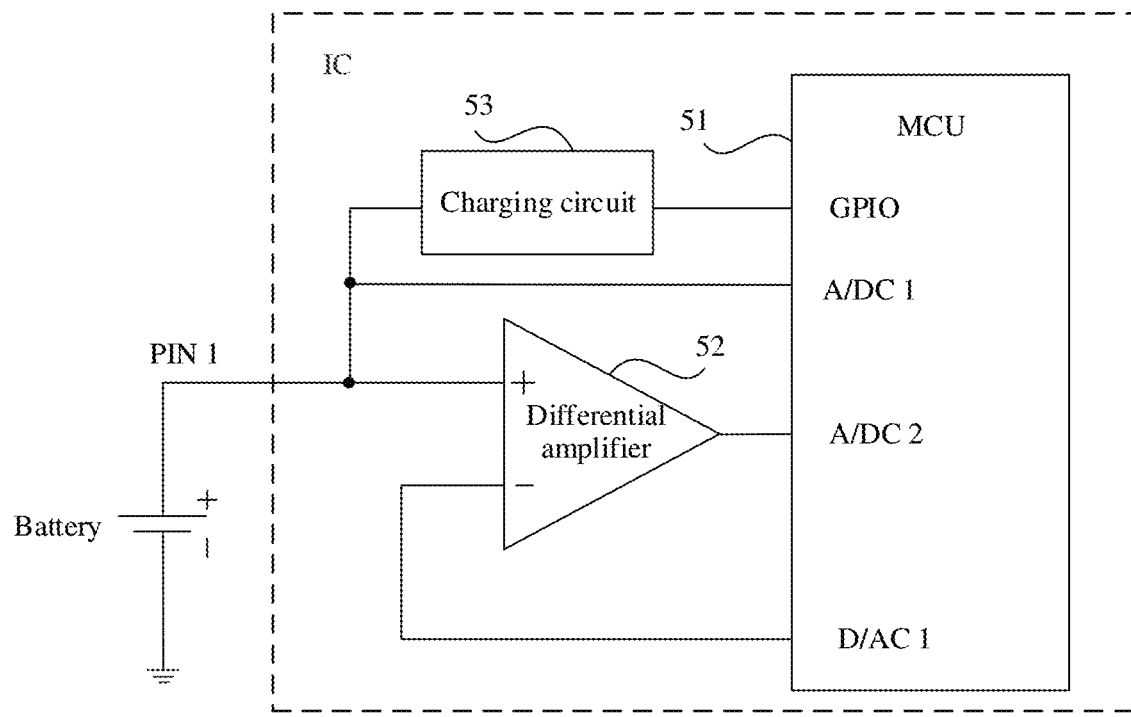
FIG. 12 is a schematic diagram of a structure of a fifth apparatus for detecting internal resistance of a battery according to an embodiment of this application.

For example, the detection apparatus shown in FIG. 9 is used as an example. FIG. 11 is an example in which the processing circuit 51 and the differential amplifier 52 in the detection apparatus are integrated into an IC chip. The IC chip may be provided with two pins: a PIN 1 and a PIN 2. The PIN 1 is a connection point between the communications interface of the processing circuit 51 and the charging circuit 53. The PIN 2 is a connection point between the first ADC interface and the first input end of the differential amplifier 52, and is connected to the positive electrode end of the battery and the charging circuit 53. Alternatively, the detection apparatus shown in FIG. 9 is used as an example. FIG. 12 is an example in which the processing circuit 51, the differential amplifier 52, and the charging circuit 53 in the detection apparatus are integrated in an IC chip. The IC chip may be provided with a pin PIN 1. The PIN 1 is a connection point between the charging circuit 53, the first ADC interface, and the first input end of the differential amplifier 52, and the PIN 1 is connected to the positive electrode end of the battery.

In embodiments of this application, the voltage value of the first comparison voltage entered by the processing circuit 51 to the differential amplifier 52 is equal to the voltage value of the first detection voltage before the battery is charged, and the voltage value of the first comparison voltage is set by the processing circuit, thereby ensuring stability of the first comparison voltage. The differential amplifier 52 separately compares the first comparison voltage used as a reference voltage with the first detection voltage obtained before the battery is charged and the second detection voltage after the battery is charged and amplifies the first detection voltage and the second detection voltage, to determine the internal resistance of the battery based on the amplified voltages. In addition, the deviation of the differential amplifier 52, and the deviation between digital-to-analog conversion and analog-to-digital conversion may be canceled in a process of determining the internal resistance. This reduces an internal resistance detection error, improves detection precision, and requires low precision of the differential amplifier 52 by the apparatus.

Figure 13:
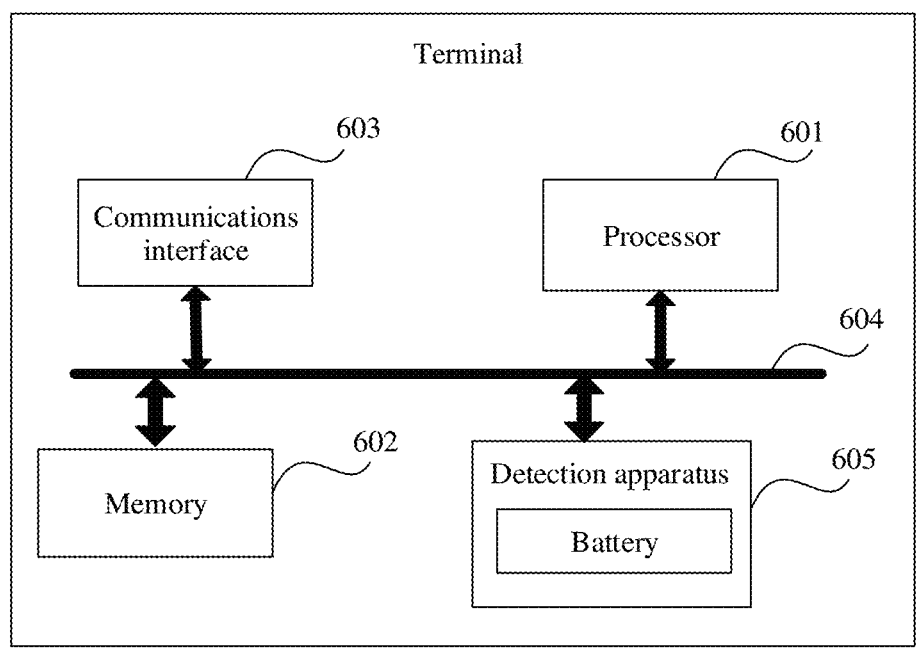
FIG. 13 is a schematic diagram of a structure of a terminal according to an embodiment of this application.

FIG. 13 is a schematic diagram of a structure of a terminal according to an embodiment of this application. The terminal includes a processor 601, a memory 602, a communications interface 603, a bus 604, and the foregoing detection apparatus 605 the internal resistance of the battery. The apparatus 605 for detecting may include the battery. The processor 601, the memory 602, the communications interface 603, and the apparatus 605 for detecting are connected through the bus 604. As a backup battery, the battery 605 is configured to supply power to the processor 601, the memory 602, and the communications interface 604.

It should be noted that, for related descriptions of the apparatus 605 for detecting the internal resistance of the battery in the terminal, refer to the foregoing related descriptions in FIG. 5 to FIG. 12. Details are not described herein again in this embodiment of this application.

The processor 601 may be a central processing unit, a general-purpose processor, a digital signal processor, an application-specific integrated circuit, a field programmable gate array or another programmable logic device, a transistor logic device, a hardware component, or any combination thereof. The processor 601 may implement or perform various example logical blocks, modules, and circuits described with reference to content disclosed in this application. The processor 601 may alternatively be a combination for implementing a computing function, for example, a combination including one or more microprocessors, or a combination of a digital signal processor and a microprocessor.

The memory 602 may be configured to store data, a software program, and a module, and mainly includes a program storage area and a data storage area. The program storage area may store an operating system, an application program required for at least one function, and the like. The data storage area may store data created during use of the terminal, and the like. The processor 602 is configured to control and manage an action of the terminal, for example, perform various functions of the terminal and process data by running or executing a software program and/or a module stored in the memory and by invoking data stored in the memory. The communications interface 603 is configured to support the terminal in communication.

The bus 604 may be a peripheral component interconnect (PCI) bus, an extended industry standard architecture (EISA) bus, or the like. The bus may be classified into an address bus, a data bus, a control bus, or the like. For ease of representation, only one thick line is used to represent the bus in FIG. 13, but this does not mean that there is only one bus or only one type of bus.

In an embodiment, the terminal may be a vehicle. Further, the vehicle may further include various subsystems. For specific related descriptions of the vehicle, refer to related descriptions of the vehicle 100 shown in FIG. 1. Details are not described herein again in this embodiment of this application.

Another aspect of this application further provides a chip system. The chip system includes a battery and the foregoing apparatus for detecting the internal resistance of the battery. In an embodiment, the battery may be integrated into the detection apparatus, or may not be integrated into the detection apparatus. In an embodiment, the chip system further includes: a processor, a memory, a communications interface, and a bus. The battery is configured to supply power to the processor, the memory, and the communications interface.

It should be noted that for related descriptions of the apparatus for detecting the internal resistance of the battery in the chip system, refer to the foregoing related descriptions of FIG. 5 to FIG. 12. Details are not described herein again in this embodiment of this application.

Finally, it should be noted that the foregoing descriptions are merely specific implementations of this application, but are not intended to limit the protection scope of this application. Any variation or replacement within the technical scope disclosed in this application shall fall within the protection scope of this application. Therefore, the protection scope of this application shall be subject to the protection scope of the claims.

What is claimed is:

1. An apparatus, comprising:
   a processing circuit coupled to a battery;
   a differential amplifier having a first input end coupled to the battery and an output end coupled to the processing circuit; and
   a charging circuit coupled to the processing circuit and the battery;
   wherein the processing circuit is configured to apply and maintain a first comparison voltage to a second input end of the differential amplifier, wherein the first comparison voltage is within a first detection voltage before the battery is charged;
   wherein the differential amplifier is configured to output a first output voltage based on the first detection voltage and the first comparison voltage;
   wherein the processing circuit is further configured to control the charging circuit to charge the battery using a constant current, and to detect a second detection voltage of the battery after the battery is charged;
   wherein the differential amplifier is further configured to output a second output voltage based on the second detection voltage and the first comparison voltage; and
   wherein the processing circuit is further configured to determine an internal resistance of the battery based on the constant current, the first output voltage, and the second output voltage.

2. The apparatus according to claim 1, wherein the processing circuit is further configured to:
   when detecting that the first detection voltage is in a preset voltage range, apply the first comparison voltage to the second input end of the differential amplifier.

3. The apparatus according to claim 1, wherein the processing circuit is further configured to:
   when the first output voltage is beyond a preset output voltage range, adjust the first comparison voltage, so that the first output voltage is in the preset output voltage range.

4. The apparatus according to claim 1, wherein the processing circuit is a microprocessor having a first analog-to-digital conversion (ADC) detection interface, a second ADC detection interface, and a digital-to-analog conversion (DAC) output interface, and the microprocessor is configured to:
   detect the first detection voltage and the second detection voltage through the first ADC detection interface, detect the first output voltage and the second output voltage through the second ADC detection interface, and output the first comparison voltage through the DAC output interface.

5. The apparatus according to claim 1, wherein the processing circuit comprises:
   a digital-to-analog conversion (DAC) circuit; and
   a microprocessor having a first ADC detection interface, a second ADC detection interface, and an analog signal output interface;
   wherein the microprocessor is configured to detect the first detection voltage and the second detection voltage through the first ADC detection interface, detect the first output voltage and the second output voltage through the second ADC detection interface, and output a pulse-width modulation (PWM) signal through the analog signal output interface; and
   the DAC circuit is configured to output the first comparison voltage after performing DAC on the PWM signal.

6. The apparatus according to claim 5, wherein the DAC circuit comprises:
   an N-stage RC filter circuit, configured to perform filtering processing on the PWM, wherein N is an integer greater than or equal to 1; and
   a voltage follower, configured to output the first comparison voltage based on the PWM signal on which filtering processing is performed.

7. The apparatus according to claim 1, wherein the constant current is greater than 0 mA and less than 200 mA.

8. The apparatus according to claim 1, wherein the processing circuit and the differential amplifier are integrated in an integrated circuit chip.

9. The apparatus according to claim 1, wherein the processing circuit, the differential amplifier, and the charging circuit are integrated in an integrated circuit chip.

10. A terminal, comprising:
a processor, a memory, a communications interface, and a battery coupled to each other via a bus, wherein the battery is configured to supply power to the processor, the memory, and the communications interface; and
an apparatus for detecting an internal resistance of the battery, wherein the apparatus comprises:
a processing circuit coupled to the battery,
a differential amplifier having a first input end coupled to the battery and an output end coupled to the processing circuit, and
a charging circuit coupled to the processing circuit; wherein
the processing circuit is configured to apply and maintain a first comparison voltage to a second input end of the differential amplifier, wherein the first comparison voltage is close to a first detection voltage before the battery is charged;
the differential amplifier is configured to output a first output voltage based on the first detection voltage and the first comparison voltage;
the processing circuit is further configured to control the charging circuit to charge the battery using a constant current, and to detect a second detection voltage of the battery after the battery is charged;
the differential amplifier is further configured to output a second output voltage based on the second detection voltage and the first comparison voltage; and
the processing circuit is further configured to determine the internal resistance of the battery based on the constant current, the first output voltage, and the second output voltage.

11. The terminal according to claim 10, wherein the terminal is a vehicle.

12. A method for detecting an internal resistance of a battery, performed by an apparatus, the apparatus comprising a processing circuit, a differential amplifier, and a charging circuit, wherein the battery is connected to the processing circuit, a first input end of the differential amplifier, and the charging circuit, and the processing circuit is further connected to an output end of the differential amplifier and the charging circuit; wherein the method comprises:
applying, by the processing circuit, a first comparison voltage to a second input end of the differential amplifier and maintaining the first comparison voltage, wherein the first comparison voltage is close to a first detection voltage before the battery is charged;
outputting, by the differential amplifier, a first output voltage based on the first detection voltage and the first comparison voltage;
controlling, by the processing circuit, the charging circuit to charge the battery using a constant current, and detecting a second detection voltage of the battery after the battery is charged;
outputting, by the differential amplifier, a second output voltage based on the second detection voltage and the first comparison voltage; and
determining, by the processing circuit, the internal resistance of the battery based on the constant current, the first output voltage, and the second output voltage.

13. The method according to claim 12, wherein applying the first comparison voltage to the second input end of the differential amplifier comprises:
when detecting that the first detection voltage is in a preset voltage range, applying the first comparison voltage to the second input end of the differential amplifier.

14. The method according to claim 13, wherein the method further comprises:
when the first output voltage is beyond a preset output voltage range, adjusting, by the processing circuit, the first comparison voltage, so that the first output voltage is in the preset output voltage range.

15. The method according to claim 13, wherein the processing circuit is a microprocessor having a first ADC detection interface, a second ADC detection interface, and a DAC output interface, and the method further comprises:
detecting the first detection voltage and the second detection voltage through the first ADC detection interface; and
detecting the first output voltage and the second output voltage through the second ADC detection interface, and outputting the first comparison voltage through the DAC output interface.

16. The method according to claim 13, wherein the processing circuit comprises: a DAC circuit, and a microprocessor having a first ADC detection interface, a second ADC detection interface, and an analog signal output interface, and the method further comprises:
detecting, by the microprocessor, the first detection voltage and the second detection voltage through the first ADC detection interface; and
detecting, by the microprocessor, the first output voltage and the second output voltage through the second ADC detection interface, and outputting, by the microprocessor, a pulse-width modulation (PWM) signal through the analog signal output interface; and
outputting, by the digital-to-analog conversion circuit, the first comparison voltage after performing DAC on the PWM signal.

17. The method according to claim 16, wherein the outputting, by the DAC circuit, the first comparison voltage after performing DAC on the PWM signal comprises:
performing filtering processing on the PWM signal; and
outputting the first comparison voltage based on the PWM signal on which filtering processing is performed.

18. The method according to claim 13, wherein the constant current is greater than 0 mA and less than 200 mA.

* * * * *